(12) United States Patent
Fujii et al.

(10) Patent No.: US 6,577,203 B2
(45) Date of Patent: Jun. 10, 2003

(54) SYSTEM AND METHODS FOR PROVIDING A VOLTAGE-CONTROLLED OSCILLATOR

(75) Inventors: Yoichi Fujii, Minowa-machi (JP); Hiroshi Kinoshita, Nagano-ken (JP); Takashi Endo, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/924,514

(22) Filed: Aug. 9, 2001

(65) Prior Publication Data

US 2002/0024397 A1 Feb. 28, 2002

(30) Foreign Application Priority Data

Aug. 29, 2000 (JP) .......................... 2000-259870

(51) Int. Cl.[7] ................................. H03R 5/32
(52) U.S. Cl. ................. 331/158; 331/176; 331/177; 331/178
(58) Field of Search ............... 331/176, 179, 331/158, 185, 177

(56) References Cited

U.S. PATENT DOCUMENTS

| | | | | |
|---|---|---|---|---|
| 4,607,239 A | * | 8/1986 | Ballato | 331/158 |
| 4,851,791 A | * | 7/1989 | Marotel | 331/158 |
| 5,347,237 A | | 9/1994 | Rokos | |
| 5,805,029 A | | 9/1998 | Theus et al. | |
| 5,883,550 A | * | 3/1999 | Watanabe et al. | 331/158 |
| 6,078,226 A | * | 6/2000 | Ajjikuttira | 331/179 |

FOREIGN PATENT DOCUMENTS

| | | |
|---|---|---|
| JP | 7-240629 A | 9/1995 |
| JP | 10-335937 A | 12/1998 |

* cited by examiner

*Primary Examiner*—Michael Tokar
*Assistant Examiner*—Lam T. Mai
(74) *Attorney, Agent, or Firm*—Oliff & Berridge, PLC

(57) ABSTRACT

This invention provides a voltage controlled oscillator that improves the linearity of frequency variable characteristics and increases the range of frequency that can be varied by a control voltage. A resistor circuit is connected between a piezoelectric resonator X and an oscillator circuit. The resistor circuit includes a plurality of oscillation-amplitude adjusting resistors Rs1 to Rsn and corresponding switches SW1 to SWn. The resistor circuit adjusts the amplitude of oscillation. When a control voltage Vc applied to a varactor Cv is at a low potential, clipping by a forward voltage of the varactor Cv is suppressed, and the frequency is linearly changed by the control voltage Vc within a range of a low potential to a high potential.

20 Claims, 20 Drawing Sheets

[FIG. 1]
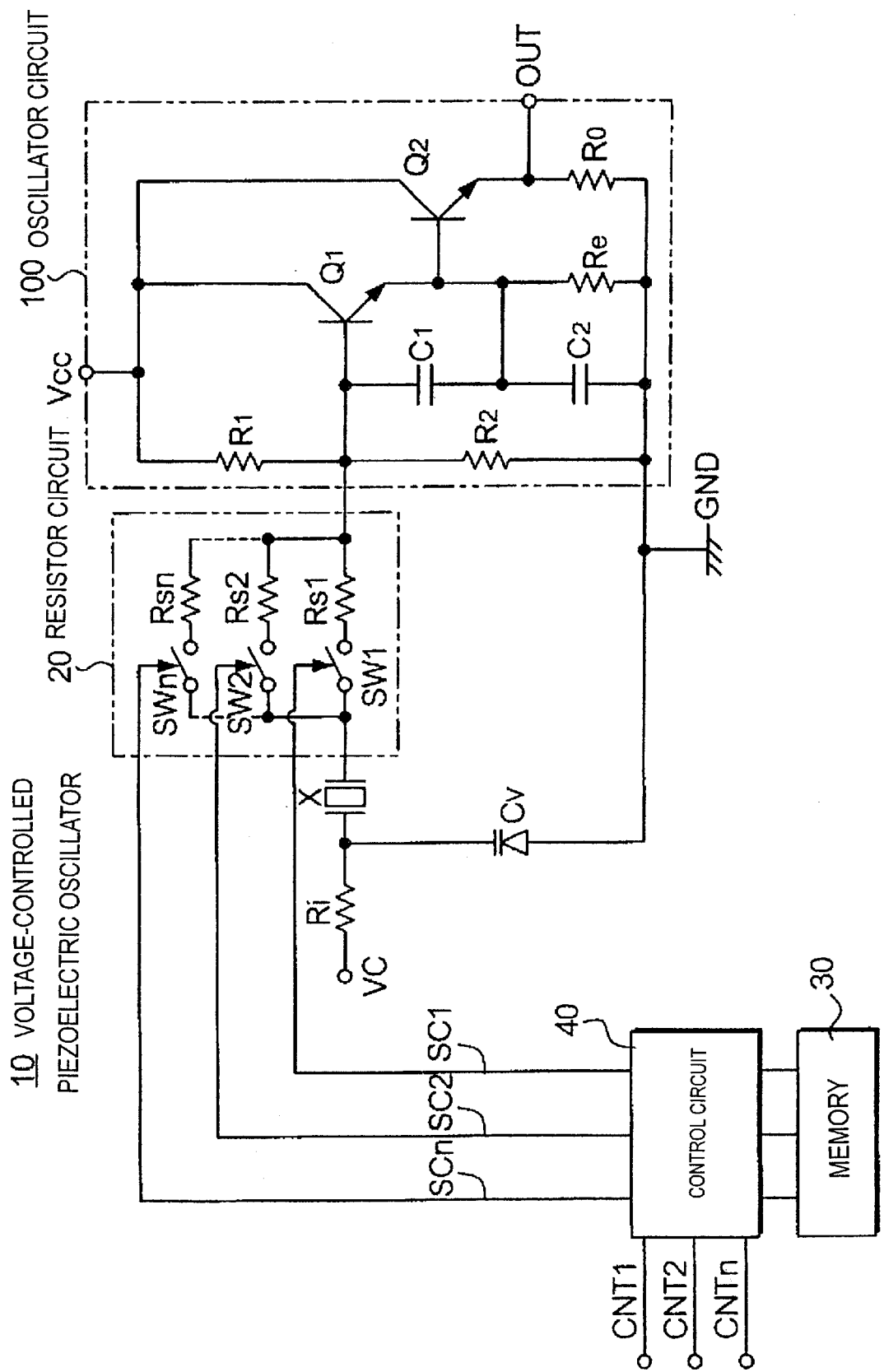

[FIG. 2]
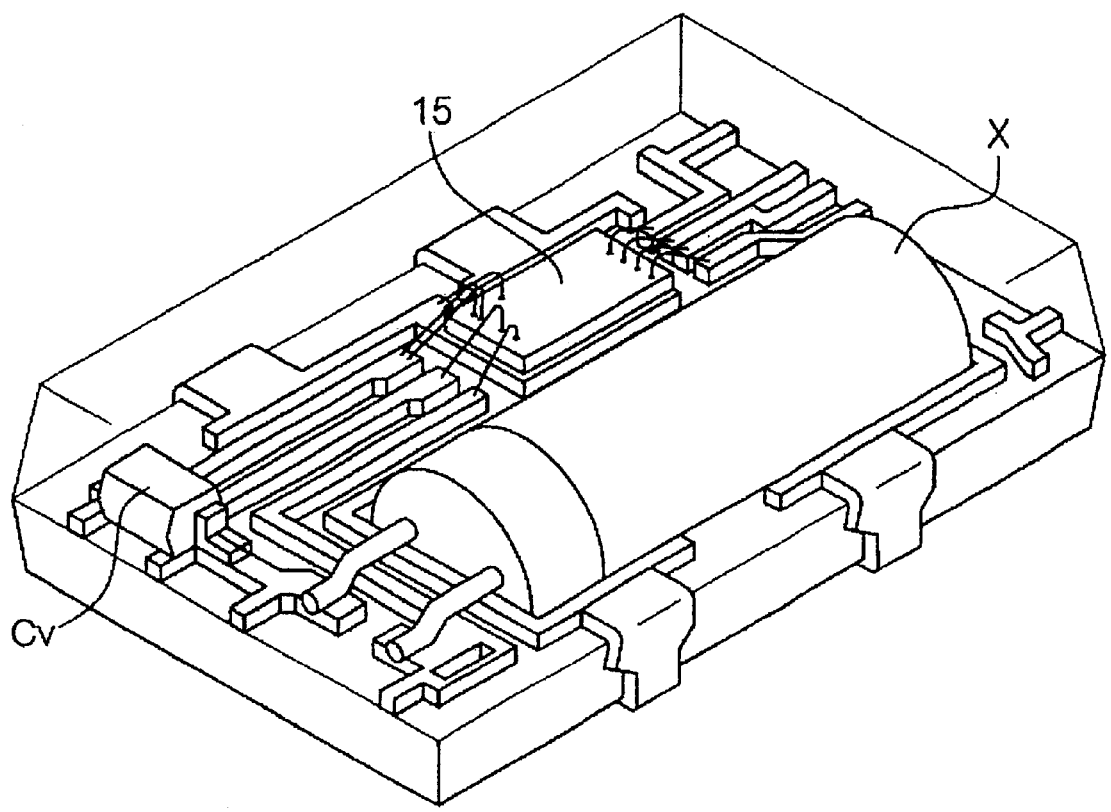

[FIG. 3]
(a)
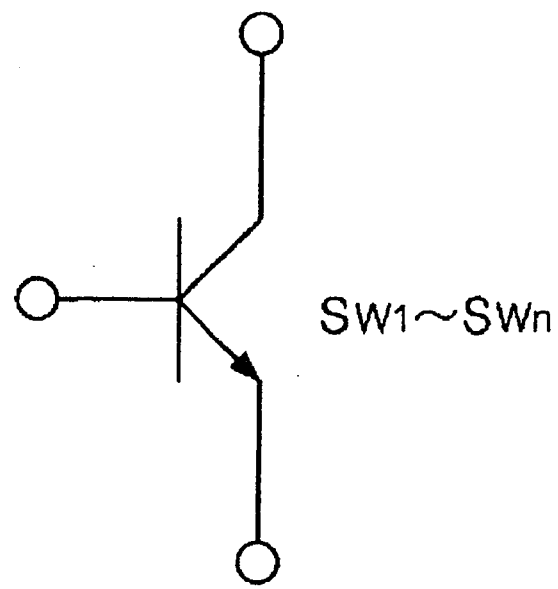
SW1~SWn
(b)
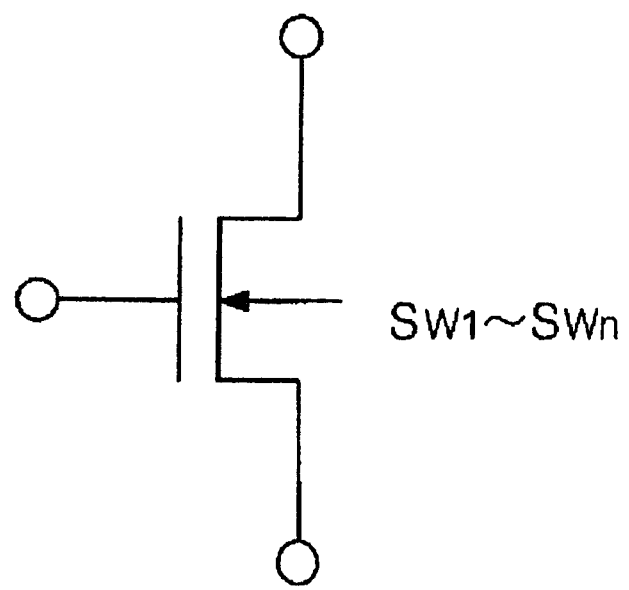
SW1~SWn

[FIG. 4]
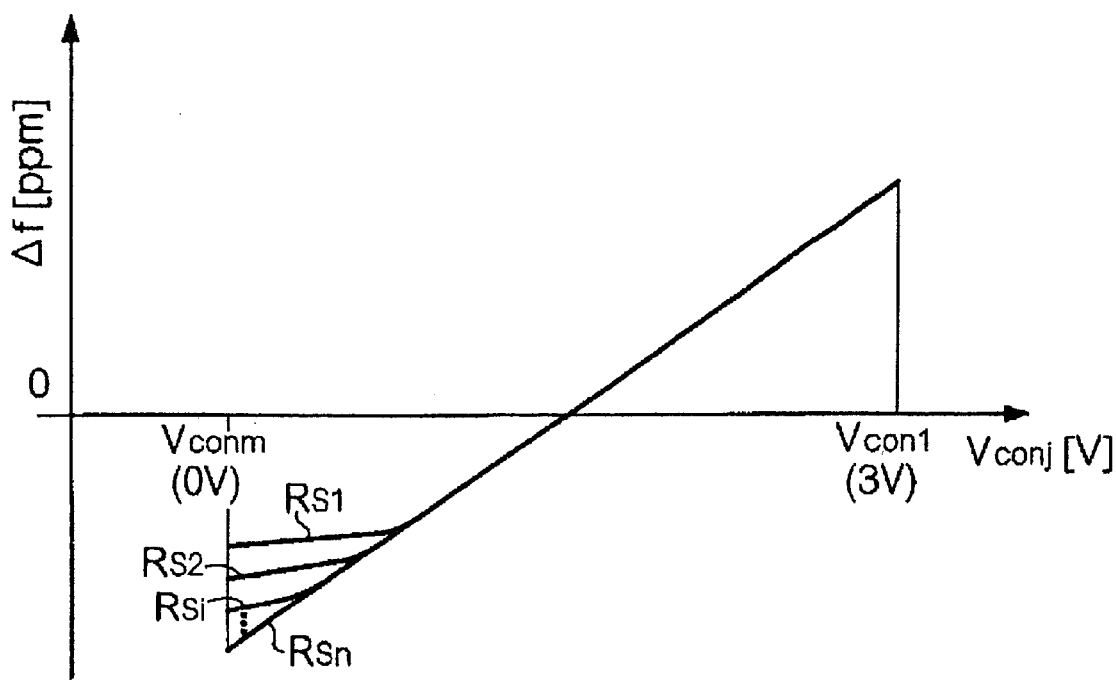
[FIG. 5]
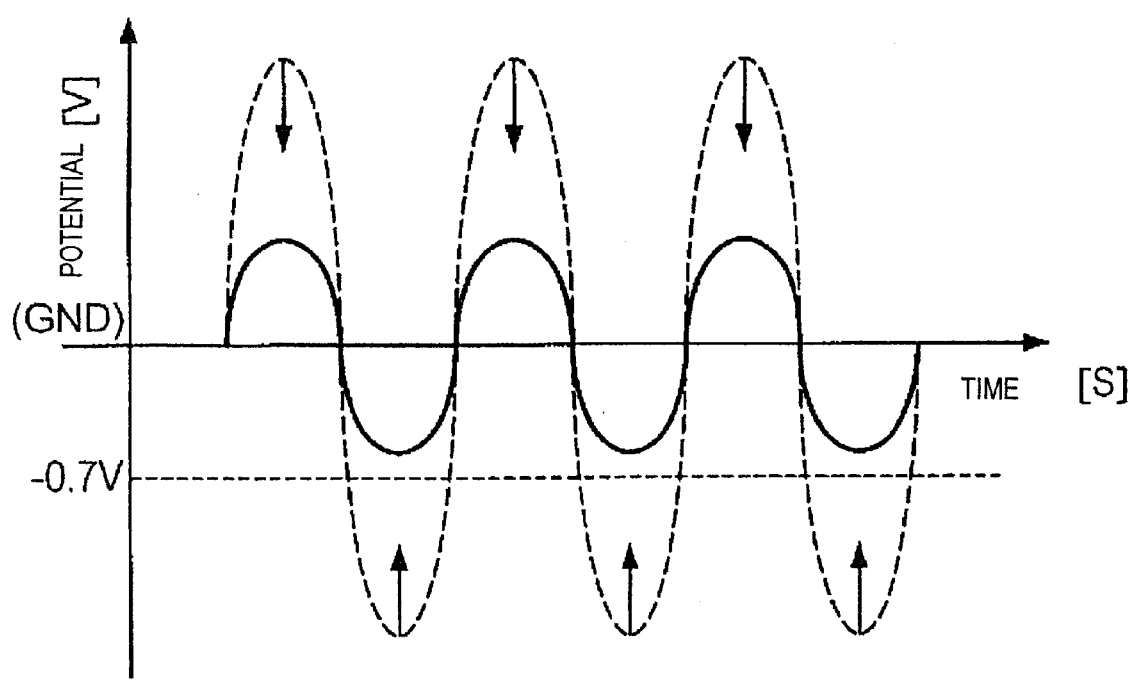

[FIG. 6]
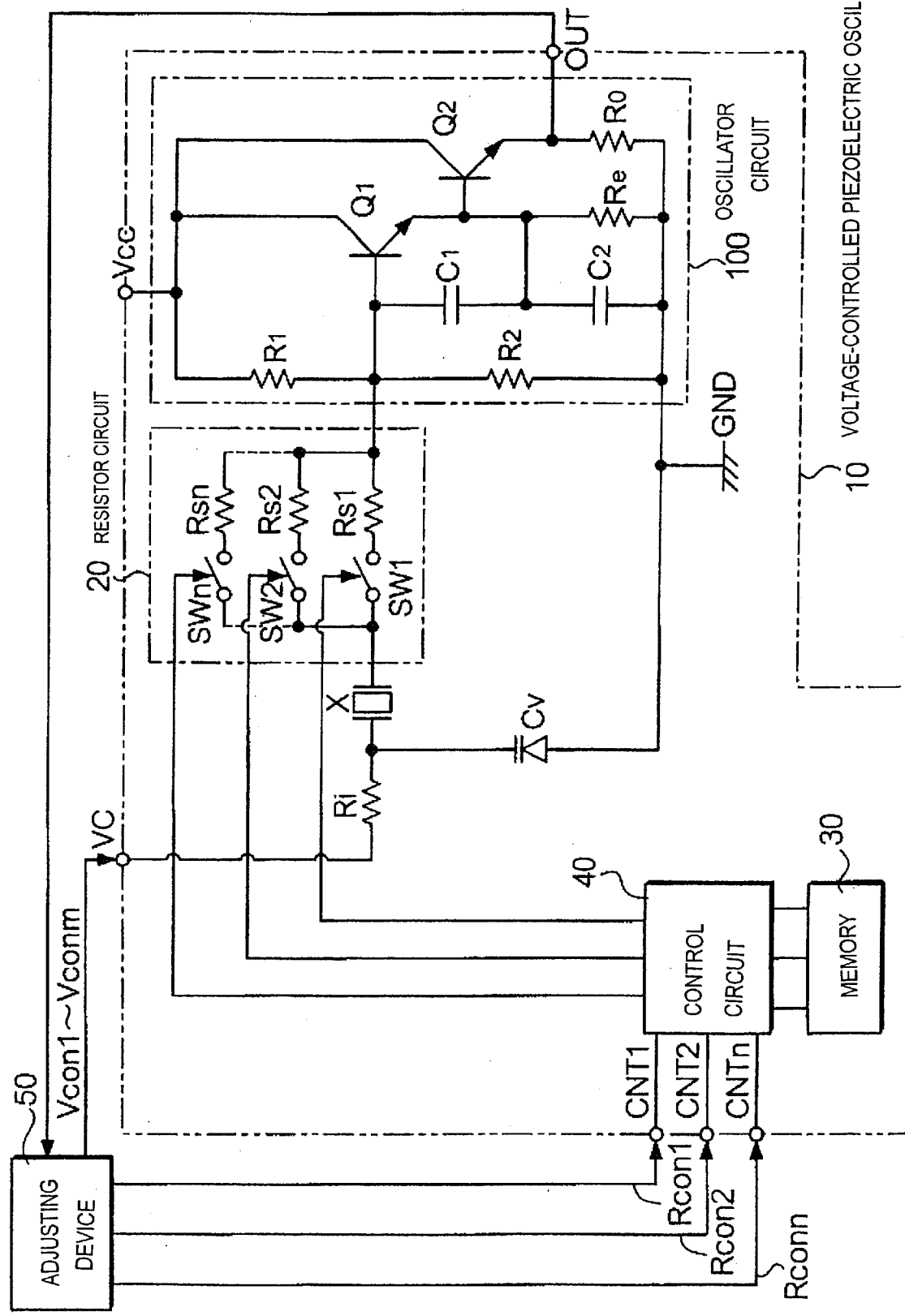

[FIG. 7]
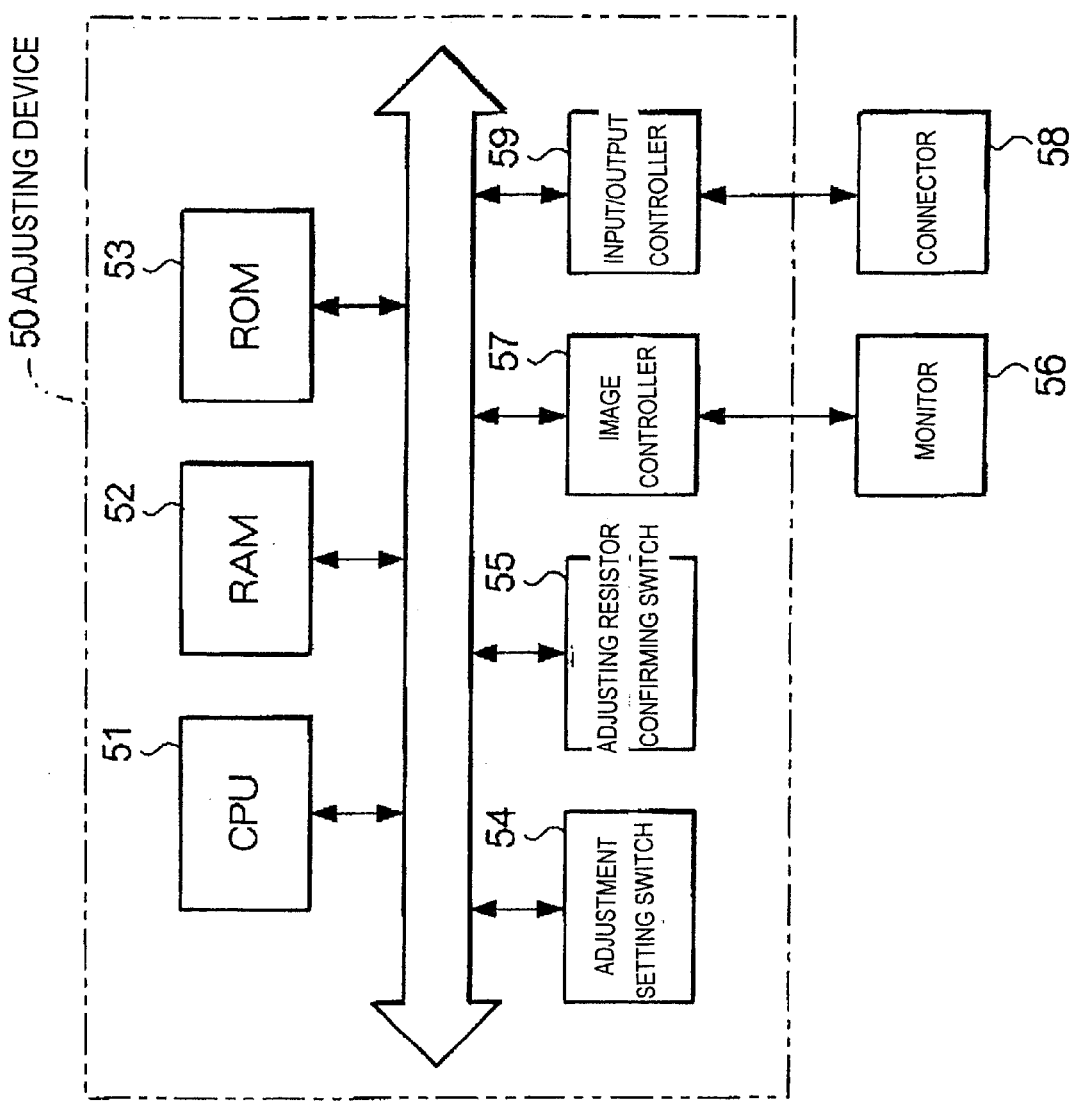

| ADJUSTING RESISTOR CONTROL SIGNAL $Rcon_i$ | RESISTOR $Rs_i$ TO BE CONNECTED |
|---|---|
| $Rcon1$ | $Rs1$ |
| $Rcon2$ | $Rs2$ |
| ⋮ | ⋮ |
| $Rconn$ | $Rsn$ |

(b)

| ADJUSTING VOLTAGE CONTROL SIGNAL $Vcon_j$ | [V] |
|---|---|
| $Vcon1$ | 3.0 |
| $Vcon2$ | 2.9 |
| ⋮ | ⋮ |
| $Vconm$ | 0 |

[FIG. 9]
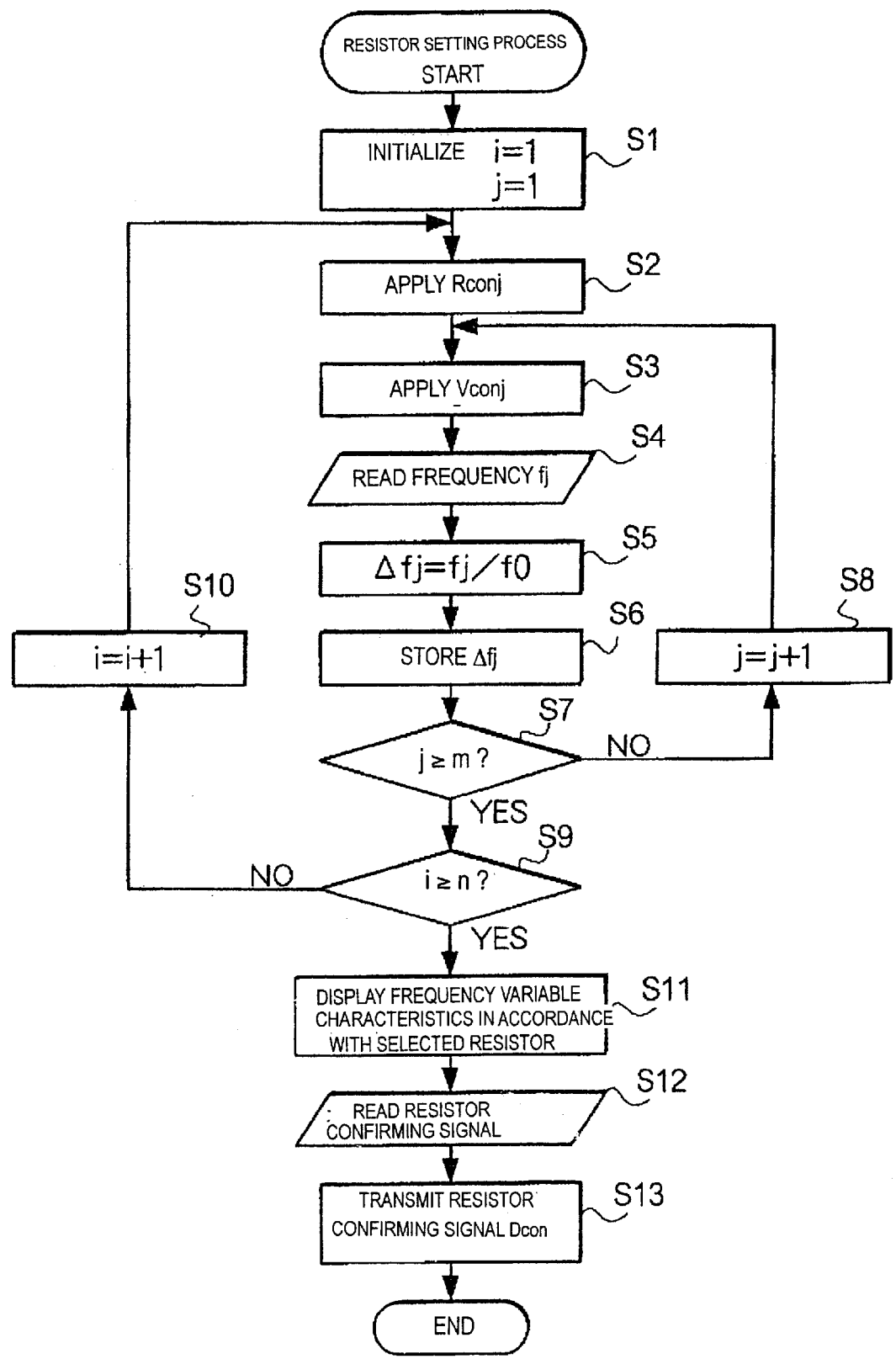

[FIG. 10]
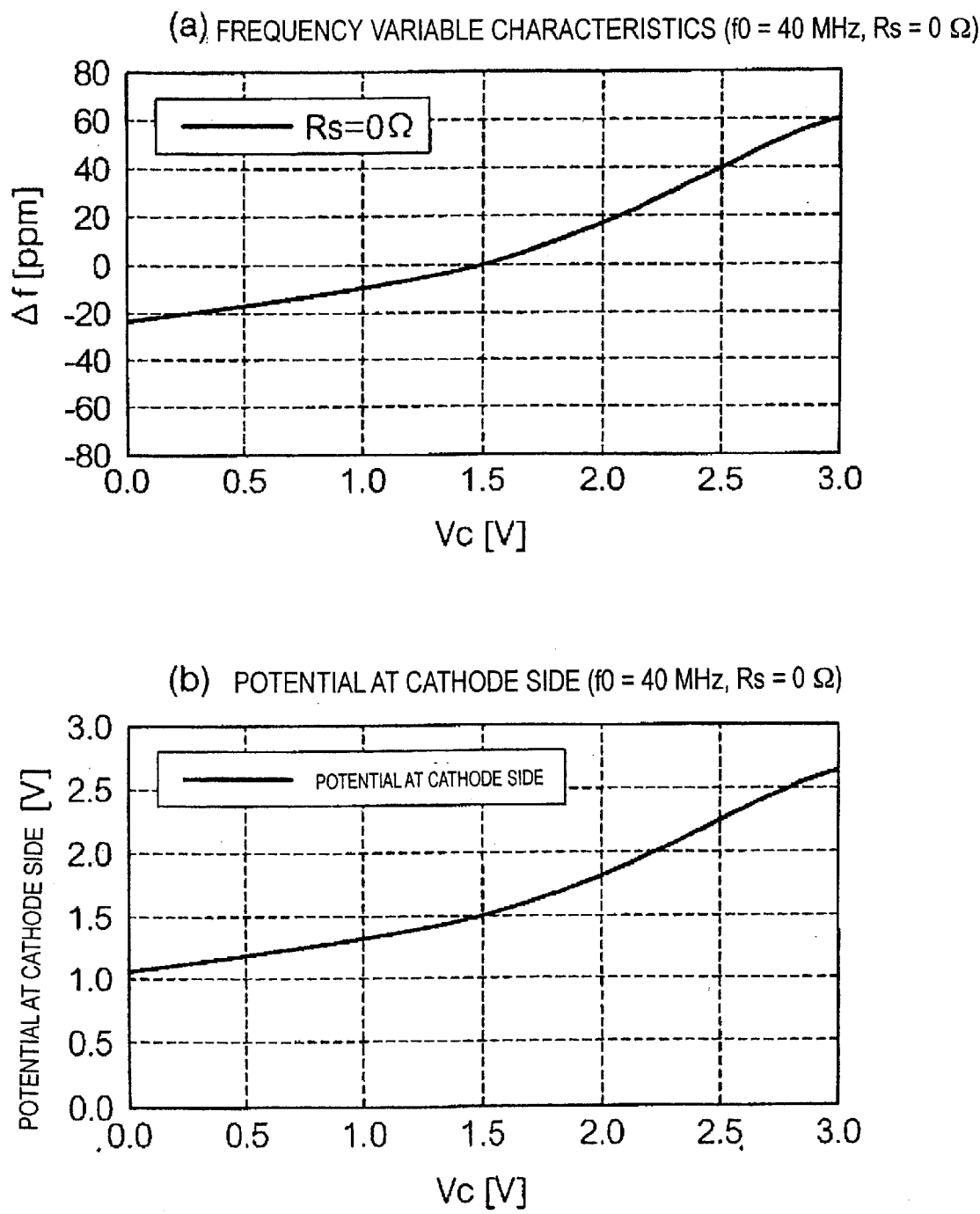

[FIG. 11]
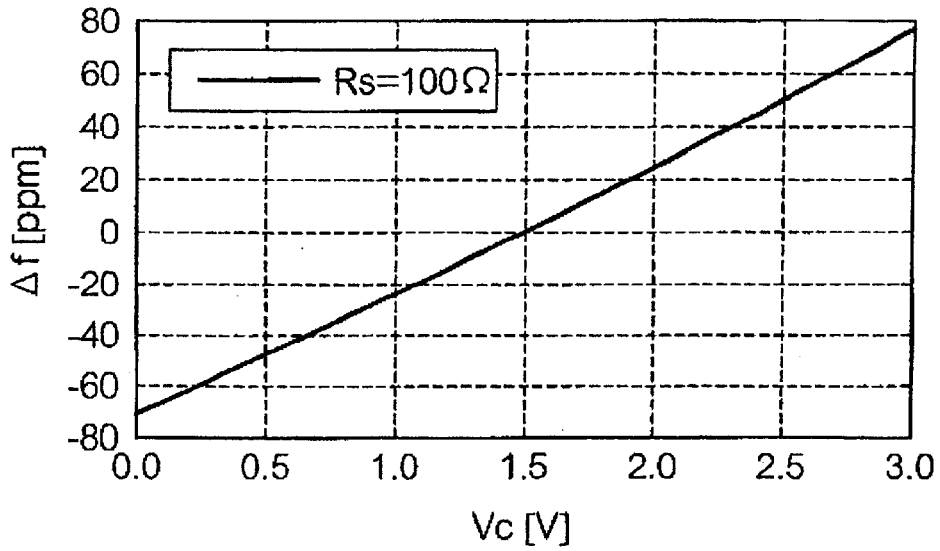
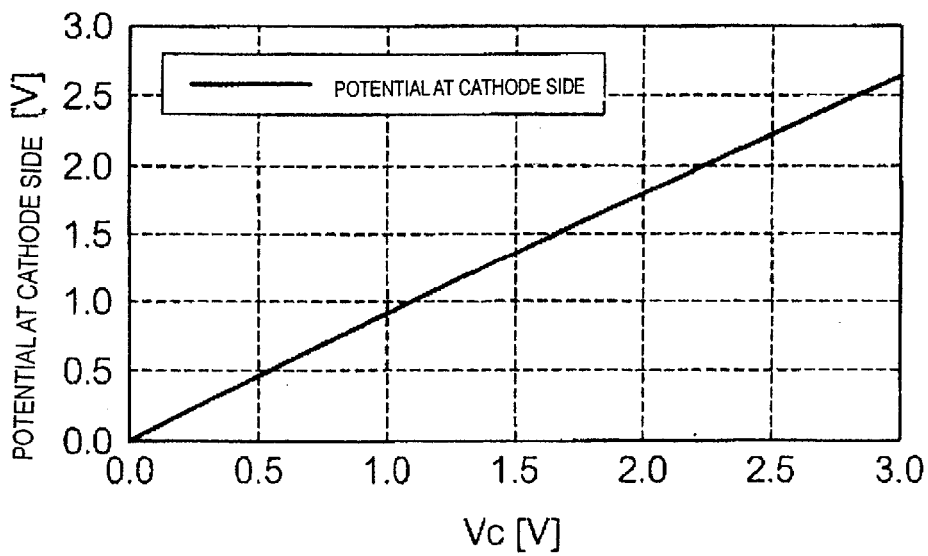

[FIG. 12]
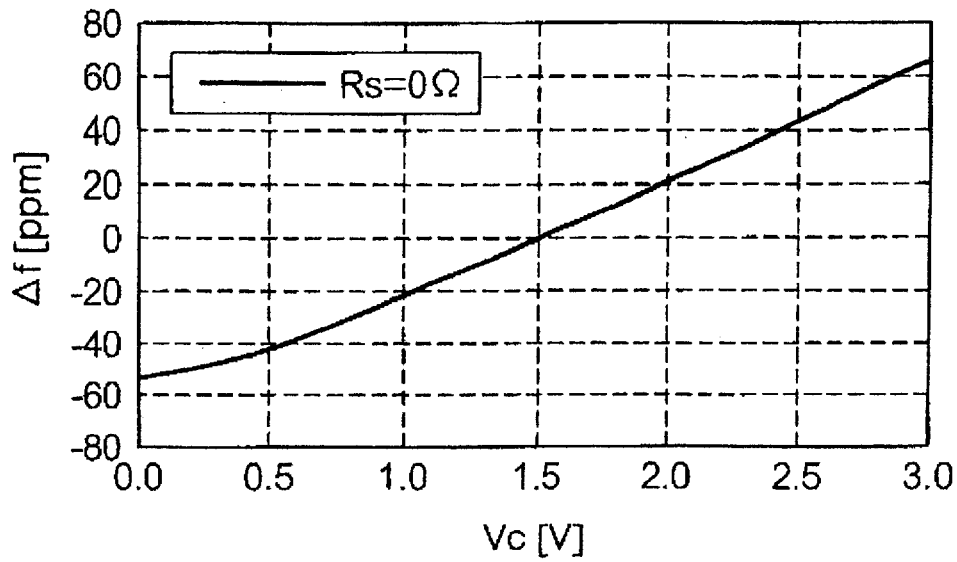
(a) FREQUENCY VARIABLE CHARACTERISTICS (f0 = 80 MHz, Rs = 0 Ω)
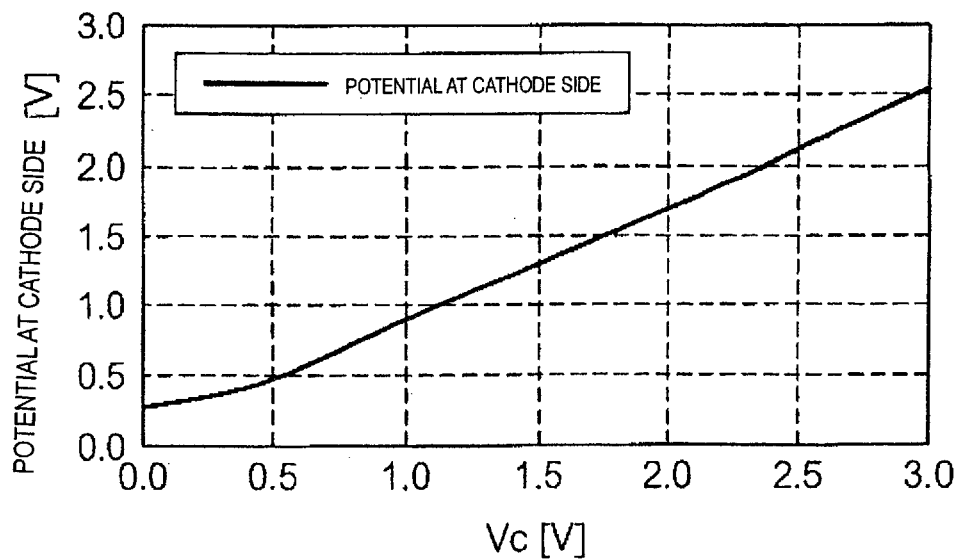
(b) POTENTIAL AT CATHODE SIDE (f0 = 80 MHz, Rs = 0 Ω)

[FIG. 13]
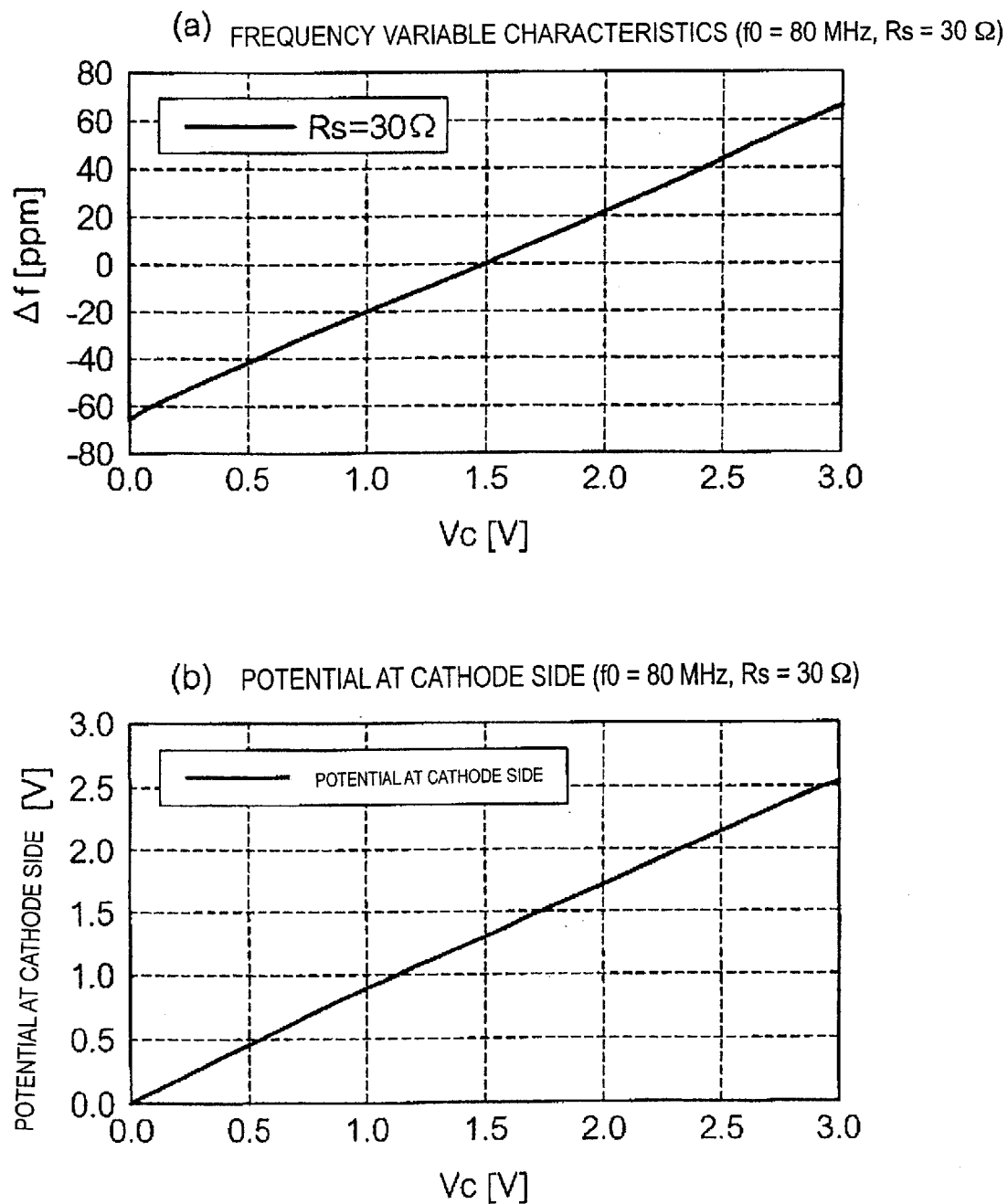

[FIG. 14]
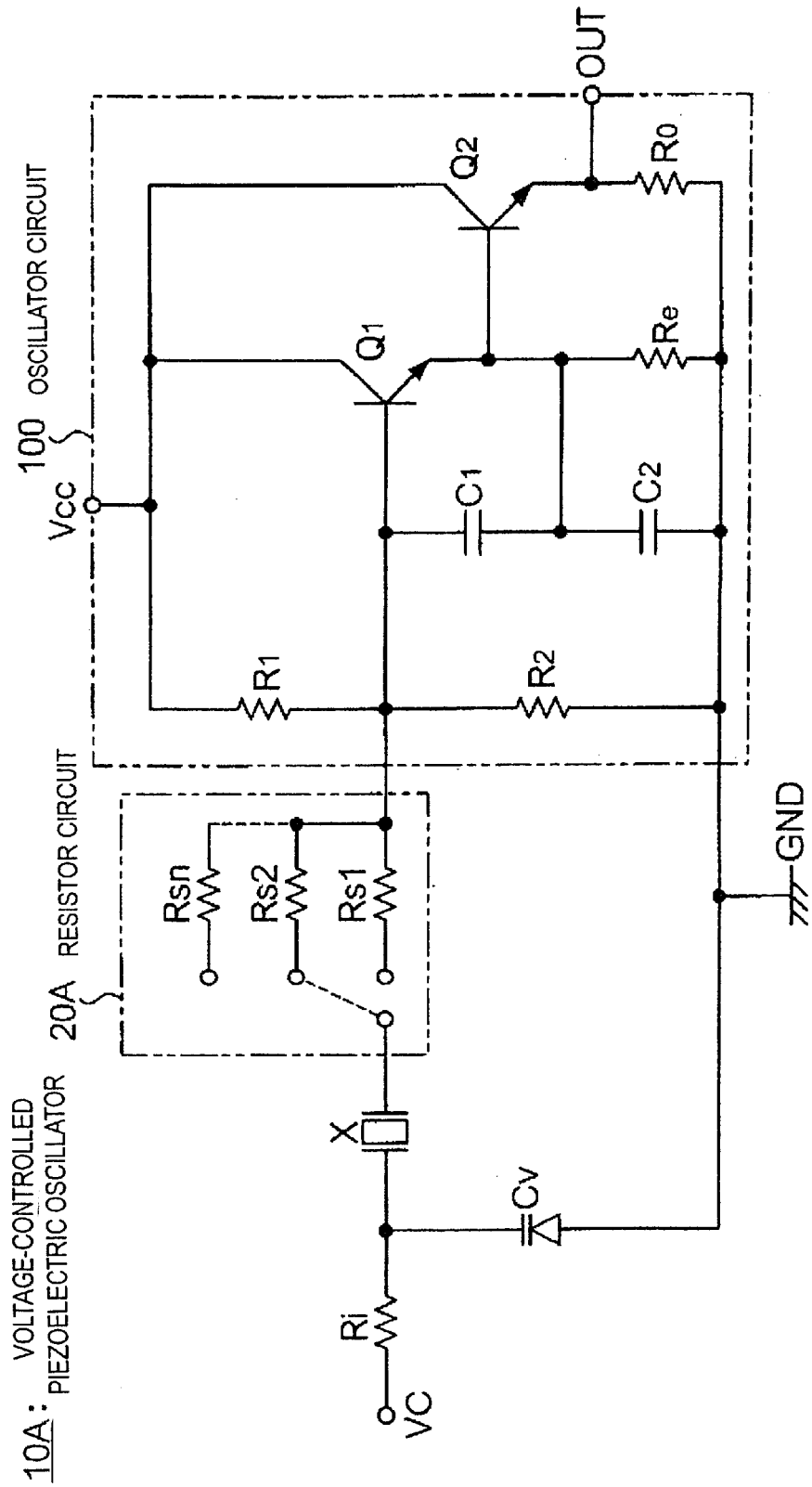

[FIG. 15]
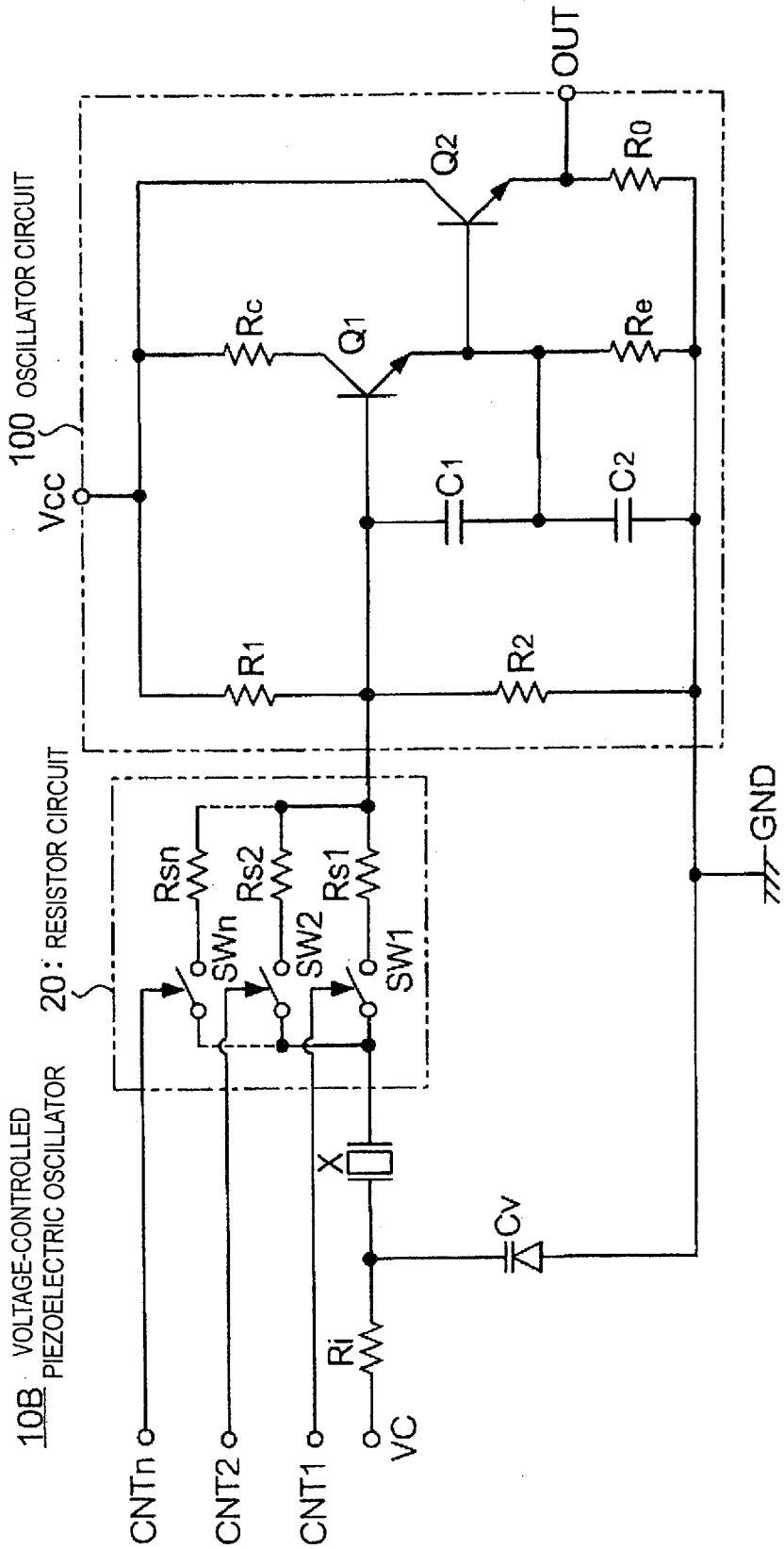

[FIG. 16]
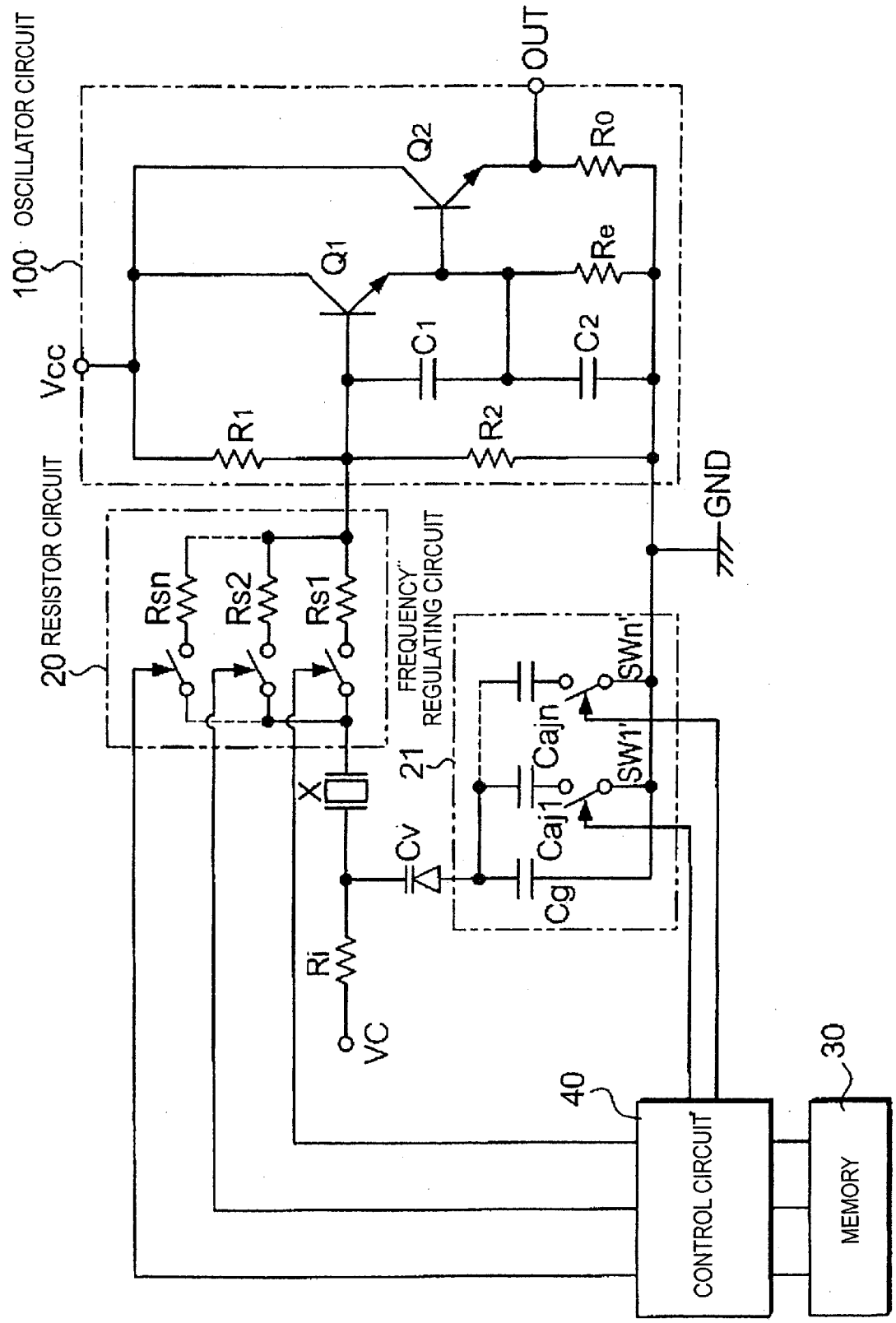

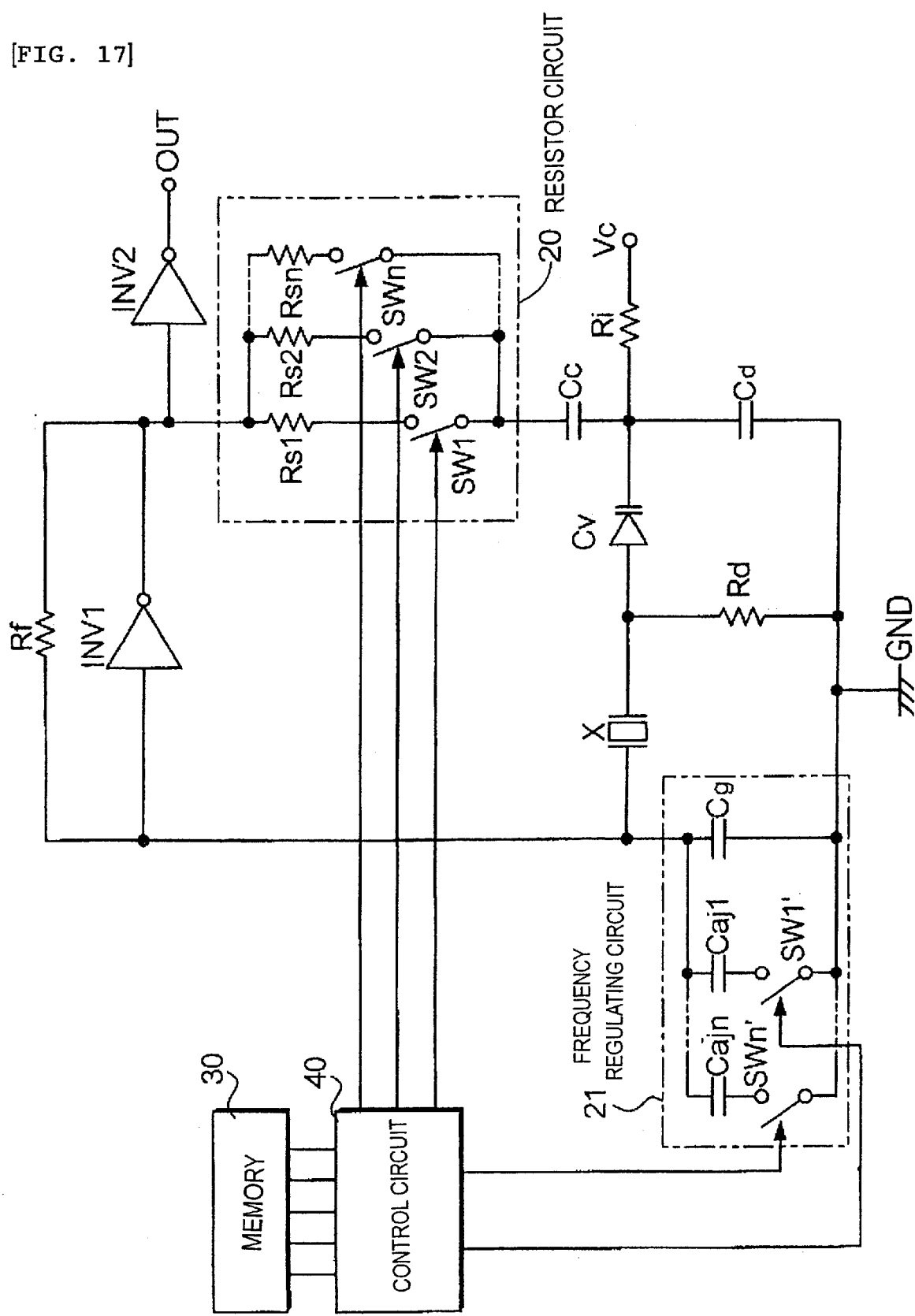
[FIG. 17]

[FIG. 18]
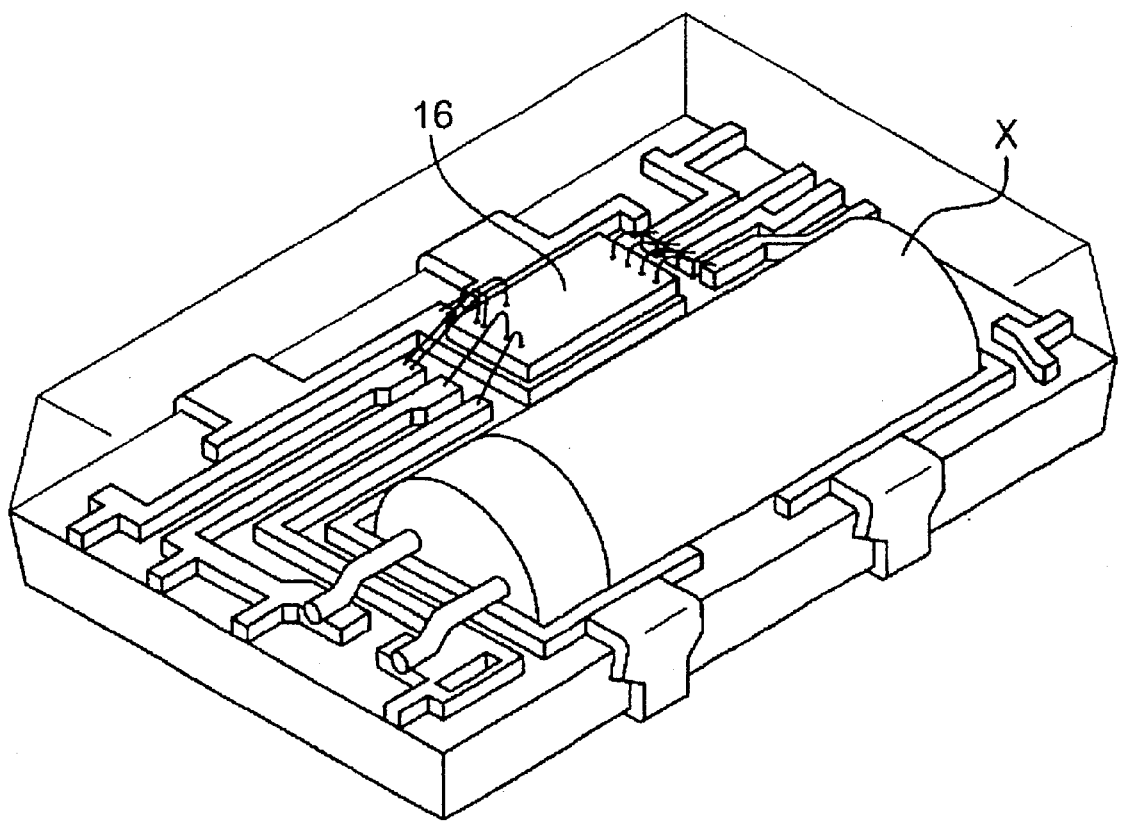

[FIG. 19]
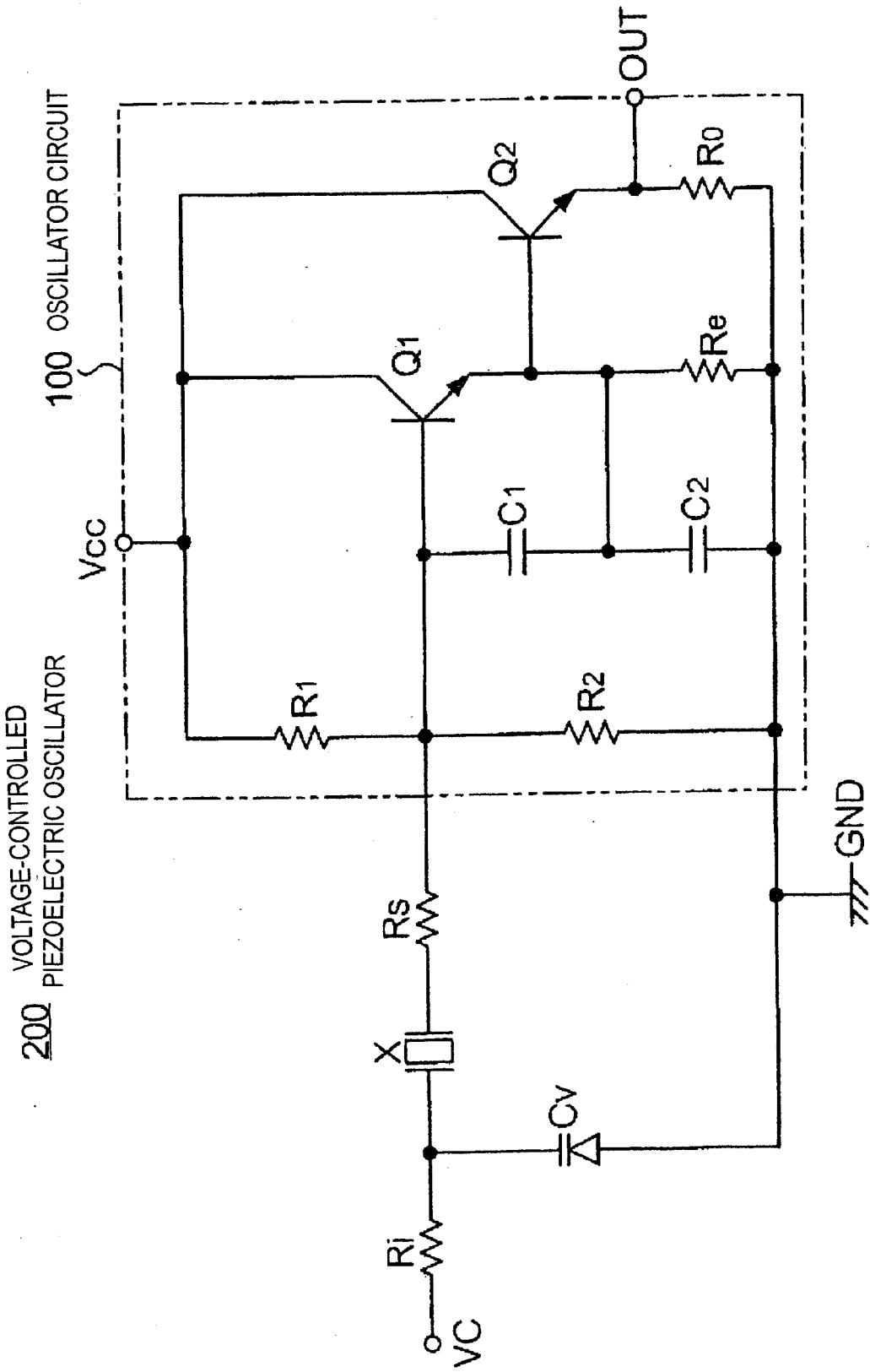

[FIG. 20]
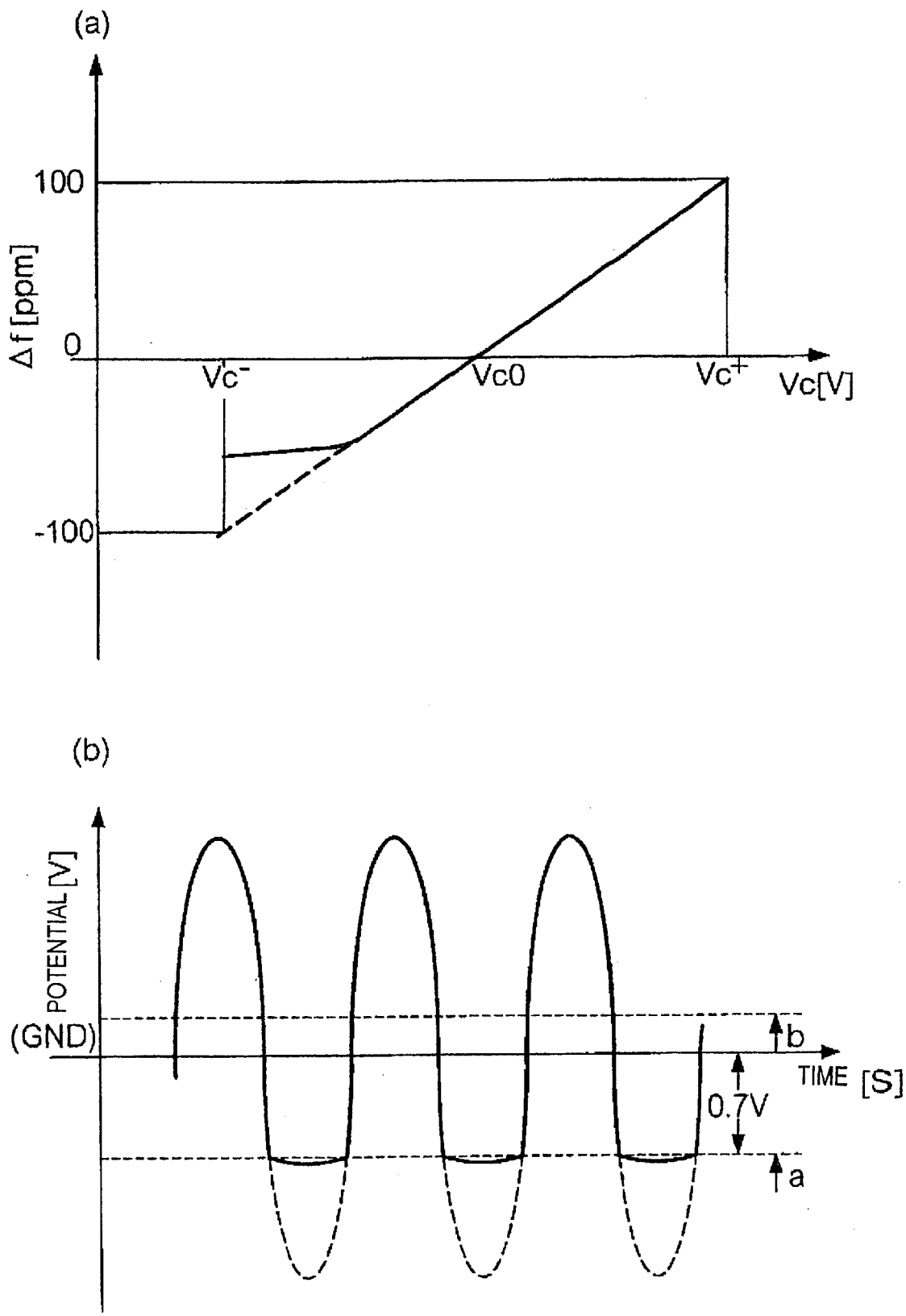

[FIG. 21]
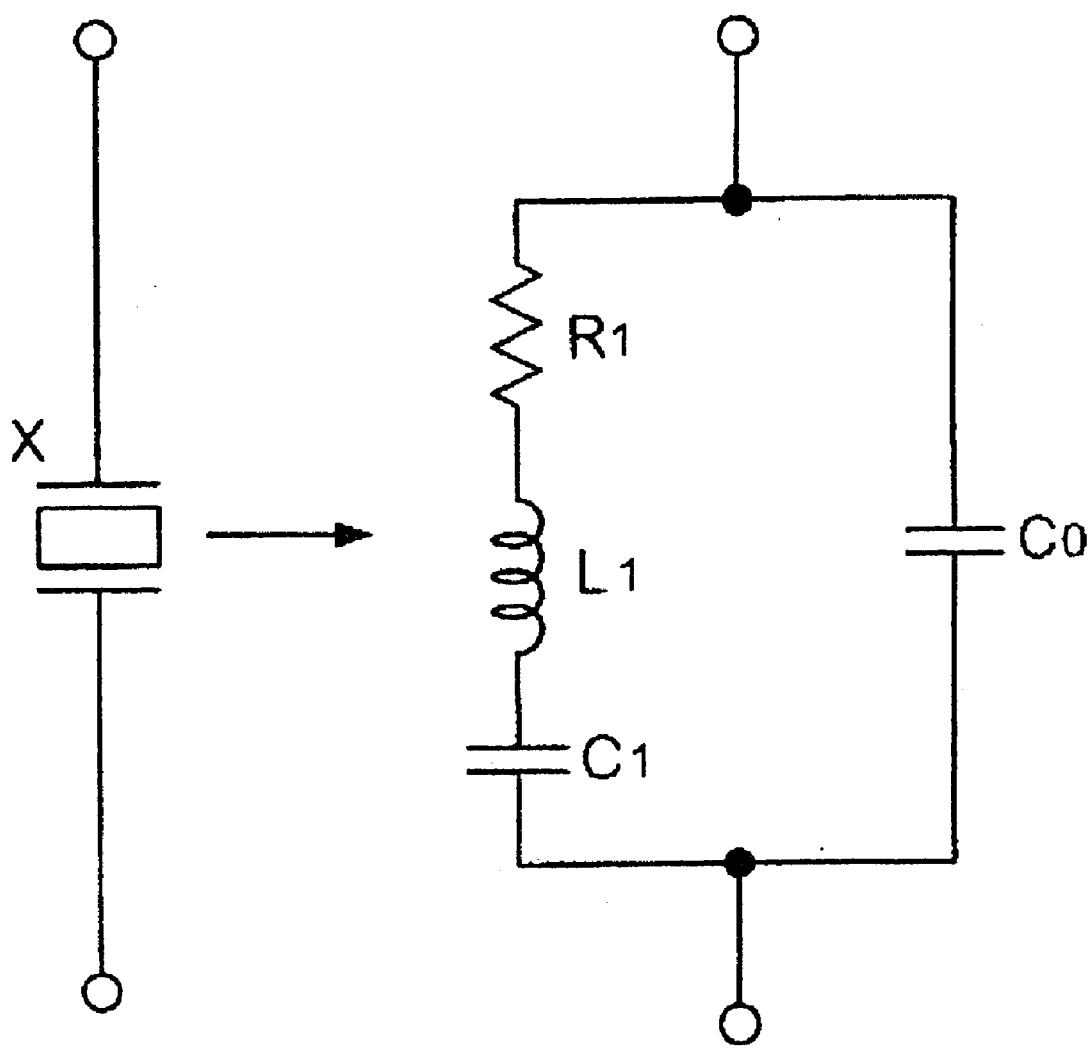

SYSTEM AND METHODS FOR PROVIDING A VOLTAGE-CONTROLLED OSCILLATOR

BACKGROUND OF THE INVENTION

1. Field of Invention

The present invention relates to voltage-controlled oscillators which are used in, for example, wireless communication apparatuses, video apparatuses, and measuring instruments, and more particularly relates to a voltage-controlled oscillator, an IC chip for a voltage-controlled oscillator, a resistance regulating apparatus, and a resistance regulating method, which require precise frequency variable characteristics.

2. Description of Related Art

An example of a conventional general voltage-controlled oscillator is shown in FIG. 19. As shown, a voltage-controlled piezoelectric oscillator 200 includes an input resistor Ri connected to a frequency control terminal VC, a piezoelectric resonator X, a variable capacitance diode (varactor) Cv, an oscillation-amplitude adjusting resistor Rs, and an oscillator circuit 100.

In the voltage-controlled piezoelectric oscillator 200 of FIG. 19, application of a control voltage Vc to the frequency control terminal VC changes the capacitance of the varactor Cv, thus adjusting an oscillation frequency f generated by resonance with the piezoelectric resonator X.

In the voltage-controlled piezoelectric oscillator 200, as shown by frequency variable characteristics indicated by dotted lines in FIG. 20(a), the voltage value of the control voltage Vc is changed within a predetermined range (range from Vc− to Vc+ with respect to a reference control voltage Vc0), and hence the oscillation frequency f of an oscillation signal S outputted from an output terminal OUT is changed linearly within a predetermined range (range from −100 to +100[ppm] with respect to a reference frequency f0, which corresponds to the reference control voltage Vc0). In FIG. 20(a), the control voltage Vc is plotted along the x-axis, and frequency deviation $\Delta f$ of the oscillation frequency f (frequency deviation $\Delta f=(f-f0)/f0$) is plotted along the y-axis, where f0 is the reference oscillation frequency.

The piezoelectric resonator X can be replaced by the equivalent circuit shown in FIG. 21. Even when at the same frequency, when the piezoelectric resonator X is formed of, for example, a crystal strip, the equivalent circuit constants may vary according to a difference in shape, such as a rectangular shape or a disk shape, a difference in size, or the like.

For example, when the resistance of resistor R1 in the equivalent circuit is smaller than the resistance of the normal piezoelectric resonator X, the impedance of an oscillator loop consisting of the varactor Cv, the piezoelectric resonator X, the oscillation-amplitude adjusting resistor Rs, and oscillation capacitors C1 and C2 is reduced, whereas the oscillation amplitude of the oscillation signal is increased. In such a case, when the control voltage Vc is set to a low potential, a desired frequency may not be achieved since frequency variable characteristics are not linear.

Specifically, as indicated by solid lines in FIG. 20(a), when the control voltage Vc applied to the frequency control terminal VC is changed from a high potential (Vc+) to a low potential (Vc−), the linearity of the frequency variable characteristics is distorted in the vicinity of the low potential.

As shown in FIG. 20(b), the cause of this is that when the control voltage Vc approaches a low potential, the capacitance of the varactor Cv is increased (the impedance is reduced), and the negative side of the oscillation amplitude is clipped by a forward voltage (approximately −0.7 V) of the varactor Cv. FIG. 20(b) shows time along the x-axis and a potential of the oscillation amplitude generated in the oscillator loop along the y-axis.

When the negative side of the oscillation amplitude is clipped by the forward voltage, the control voltage Vc applied to the varactor Cv is greater than the control voltage Vc applied to the frequency control terminal VC by an average potential (see arrow b in FIG. 20(b)). Hence, there is a difference between the control voltage Vc applied to the varactor Cv and the actual potential of the varactor Cv. This results in distortion of the linearity of the frequency variable characteristics as the control voltage Vc approaches Vc− (GND).

In the voltage-controlled piezoelectric oscillator 200, when the components other than the piezoelectric resonator X and the varactor Cv are formed as an IC chip, the oscillation-amplitude adjusting resistor Rs has a fixed value. It is therefore necessary to provide a plurality of IC chips in order that each IC chip has the oscillation-amplitude adjusting resistor Rs with a different resistance for each piezoelectric resonator X with a different oscillation frequency f. As a result, the cost of producing is increased.

In view of the above circumstances, it is an object of the present invention to provide a voltage-controlled oscillator, an IC chip for a voltage-controlled oscillator, a resistance regulating apparatus, and a resistance regulating method, which are capable of improving the linearity of frequency variable characteristics and increasing the range of frequency that can be varied by a control voltage.

SUMMARY OF THE INVENTION

The present invention relates to a voltage-controlled oscillator including a piezoelectric resonator having a variable reactance element connected in series to an input side of the piezoelectric resonator, an oscillator circuit connected to a variable reactance element, and a resistor circuit provided in an oscillator loop including the piezoelectric resonator, the variable reactance element, and the oscillator circuit, the resistor circuit including a plurality of oscillation-amplitude adjusting resistors which are selectively inserted.

The present invention further provides that the resistor circuit includes a switch for connecting or disconnecting the oscillation-amplitude adjusting resistors based on a resistor connection control signal. Further, the switch can include a semiconductor switch.

Additionally, the present invention can provide a resistor information memory for storing resistor connection control data, and a control circuit for storing the resistor connection control data beforehand in the resistor information memory, based on an adjusting resistor control signal which is supplied from the outside, and for outputting a resistor connection control signal for controlling the switch based on the adjusting resistor control signal or the resistor connection control data.

The above-described resistor circuit can be such that one end of each of the oscillation-amplitude adjusting resistors is connected to the oscillator loop and the other end includes a bonding pad.

The present invention may further provide a capacitor circuit connected to the variable reactance element, the capacitor circuit including a plurality of selectable-capacitance elements, and a capacitance connecting circuit for connecting to the variable reactance element a desired capacitive element from among the selectable-capacitance elements.

The piezoelectric resonator can be a crystal resonator. Further, components other than the piezoelectric resonator and the variable reactance element can be formed as an IC chip, wherein in the IC chip, the piezoelectric resonator, and the variable reactance element can be integrally mold-sealed. Additionally, the IC chip, the piezoelectric resonator, and the variable reactance element can be contained in a single package.

The present invention further provides an IC chip for a voltage-controlled oscillator, the voltage-controlled oscillator including a piezoelectric resonator, a variable reactance element connected in series to the input side of the piezoelectric resonator, and an oscillator circuit connected to the variable reactance circuit. The IC chip is characterized by including a resistor circuit provided in an oscillator loop including the piezoelectric resonator, the variable reactance element, and the oscillator circuit, the resistor circuit including a plurality of oscillation-amplitude adjusting resistors which are selectively inserted.

The present invention further provides that the resistance regulating apparatus can include a frequency detecting device for sequentially selecting one from among oscillation-amplitude adjusting resistors and detecting the frequency of an oscillation signal in a state in which a predetermined reference control voltage is gradually applied to a control voltage terminal, and an oscillation-amplitude adjusting resistor confirming device for confirming the desired oscillation-amplitude adjusting resistor which corresponds to a predetermined oscillation frequency, based on the detected frequency of each oscillation-amplitude adjusting resistor.

The present invention further provides that the resistance regulating apparatus can include a frequency detecting device for sequentially selecting one from among oscillation-amplitude adjusting resistors and detecting the frequency of an oscillation signal in a state in which a predetermined reference control voltage is gradually applied to a control voltage terminal, a frequency variable characteristic generating device for generating a frequency variable characteristic of each oscillation-amplitude adjusting resistor, based on the detected frequency of each oscillation-amplitude adjusting resistor, and an oscillation-amplitude adjusting resistor confirming device for confirming the desired oscillation-amplitude adjusting resistor which corresponds to a predetermined oscillation frequency, based on the generated frequency variable characteristic of each oscillation-amplitude adjusting resistor.

The present invention provides that the resistance regulating method can include a frequency detecting step of sequentially selecting one from among oscillation-amplitude frequency adjusting resistors and detecting the frequency of an oscillation signal in a state in which a predetermined reference control voltage is gradually applied to a control voltage terminal, and an oscillation-amplitude adjusting resistor confirming step of confirming the desired oscillation-amplitude adjusting resistor which corresponds to a predetermined oscillation frequency, based on the detected frequency of each oscillation-amplitude adjusting resistor.

The present invention further provides that the resistance regulating method can further include a frequency detecting step of sequentially selecting one from among oscillation-amplitude adjusting resistors and detecting the frequency of an oscillation signal in a state in which a predetermined reference control voltage is gradually applied to a control voltage terminal, a frequency variable characteristic generating step of generating a frequency variable characteristic of each oscillation-amplitude adjusting resistor, based on the detected frequency of each oscillation-amplitude adjusting resistor, and an oscillation-amplitude adjusting resistor confirming step of confirming the desired oscillation-amplitude adjusting resistor, based on the generated frequency variable characteristic of each oscillation-amplitude adjusting resistor.

BRIEF DESCRIPTION OF THE DRAWINGS

The invention will be described with reference to the accompanying drawings, in which like elements are referred to with like number, and in which:

FIG. 1 is an exemplary diagram showing the principle of a voltage-controlled piezoelectric oscillator of a first embodiment;

FIG. 2 is a perspective view of the voltage-controlled piezoelectric oscillator of the first embodiment;

FIG. 3 illustrates cases when switches are formed of semiconductor devices;

FIG. 4 is a graph showing frequency variable characteristics of the first embodiment;

FIG. 5 is a graph showing oscillation amplitude of the first embodiment;

FIG. 6 is a circuit diagram showing the voltage-controlled piezoelectric oscillator of the first embodiment to which an adjusting device is connected;

FIG. 7 is an exemplary block diagram of the structure of the adjusting device;

FIG. 8 illustrates the correspondence concerning signals included in the adjusting device;

FIG. 9 is an exemplary flowchart showing a resistor setting process performed by the adjusting device;

FIG. 10 includes graphs showing frequency variable characteristics and potentials at the cathode side of an example (f0=40 MHz and Rs=0Ω) of the first embodiment;

FIG. 11 includes graphs showing frequency variable characteristics and potentials at the cathode side of an example (f0=40 MHz and Rs=100Ω) of the first embodiment;

FIG. 12 includes graphs showing frequency variable characteristics and potentials at the cathode side of an example (f0=80 MHz and Rs=0Ω) of the first embodiment;

FIG. 13 includes graphs showing frequency variable characteristics and potentials at the cathode side of an example (f0=80 MHz and Rs=30Ω) of the first embodiment;

FIG. 14 is a circuit diagram of a voltage-controlled piezoelectric oscillator of a second embodiment;

FIG. 15 is an exemplary circuit diagram of a voltage-controlled piezoelectric oscillator of a third embodiment;

FIG. 16 is a circuit diagram of a voltage-controlled piezoelectric oscillator of a first modification;

FIG. 17 is an exemplary circuit diagram of a voltage-controlled piezoelectric oscillator of a second modification;

FIG. 18 is a perspective view of a voltage-controlled piezoelectric oscillator of a third modification;

FIG. 19 is a circuit diagram of a voltage-controlled piezoelectric oscillator of the related art;

FIG. 20 includes graphs showing frequency variable characteristics and oscillation amplitude of the related art; and FIG. 21 is a circuit diagram of an equivalent circuit of a piezoelectric resonator.

DETAILED DESCRIPTION OF PREFERRED EMBODIMENTS

The preferred embodiments of the present invention will be described with reference to the drawings.

FIG. 1 shows the structure of a voltage-controlled piezoelectric oscillator 10 of a first embodiment. The voltage-controlled piezoelectric oscillator 10 includes a frequency control terminal VC for applying a control voltage Vc for changing an oscillation frequency f of an oscillation signal S outputted from an output terminal OUT. Further, the oscillator 10 includes an input resistor Ri, one end of which is connected to the frequency control terminal VC to suppress influence on an oscillation frequency control circuit (not shown), which is to be connected by a user to the frequency control terminal VC, and the input resistor Ri being connected to the oscillation frequency control circuit. Additionally, the oscillator includes a piezoelectric resonator X, one end of which is connected to the other end of the input resistor Ri, a varactor Cv, the cathode terminal of which is connected to the node between the input resistor Ri and the piezoelectric resonator X, a resistor circuit 20 for adjusting the oscillation frequency, having one end connected to the other end of the piezoelectric resonator X, an oscillator circuit 100 connected to a stage subsequent to resistors Rs of the resistor circuit 20; a memory 30, and a control circuit 40.

As shown in FIG. 2, regarding the voltage-controlled piezoelectric oscillator 10, the components other than the piezoelectric resonator X and the varactor Cv can be formed as an IC chip 15. The IC chip 15, the piezoelectric resonator X, and the varactor Cv are mold-sealed. Terminals exposed to the outside include the frequency control terminal VC; control circuit signal input terminals or resistor connection control signal input terminals CNT1 to CNTn, a high-potential power supply terminal VCC, the output terminal OUT, and a low-potential power supply terminal GND.

The structure of each section will be greater described in detail. As shown in FIG. 1, the oscillator circuit 100 includes a first bias resistor R1, one end of which is connected to the high-potential power supply terminal VCC, and the other end is connected to the other end of the oscillation-amplitude adjusting resistor Rs and a second bias resistor R2, one end of which is connected to the node between the oscillation-amplitude adjusting resistor Rs and the first bias resistor R1, and the other end is connected to the low-potential power supply GND. The circuit 100 also includes an NPN transistor Q1, the base terminal of which is connected to the node between the oscillation-amplitude adjusting resistor Rs and the first bias resistor R1, and the collector terminal is connected to the high-potential power supply terminal VCC, an emitter resistor Re, one end of which is connected to the emitter terminal of the NPN transistor Q1, and the other end is connected to the low-potential power supply GND. The circuit includes an NPN transistor Q2, the base terminal of which is connected to the node between the emitter terminal of the NPN transistor Q1 and the emitter resistor Re, and the collector terminal is connected to the high-potential power supply terminal VCC, an emitter resistor RO, one end of which is connected to the emitter terminal of the NPN transistor Q2, and the other end is connected to the low-potential power supply GND.

As further shown in FIG. 1, the circuit 100 includes a first oscillating capacitor C1, one end of which is connected to the node between the base terminal of the NPN transistor Q1 and the oscillation-amplitude adjusting resistor Rs, and the other end is connected to the node between the emitter terminal of the NPN transistor Q1 and the emitter resistor Re, and a second oscillating capacitor C2, one end of which is connected to the node between the emitter terminal of the NPN transistor Q1 and the emitter resistor Re, and the other end is connected to the low-potential power supply GND.

As shown in FIG. 1, the structure of resistor circuit 20 includes oscillation-amplitude adjusting resistors Rs1 to Rsn and switches SW1 to SWn connected to the oscillation-amplitude adjusting resistors Rs1 to Rsn, respectively. The switches SW1 to SWn are for connecting or disconnecting the oscillation-amplitude adjusting resistors Rs1 to Rsn, based on resistor connection control signals SC1 to SCn outputted from the control circuit 40. The resistance of the oscillation-amplitude adjusting resistors Rs1 to Rsn may be set different from one another or may be the same.

When the resistance of the oscillation-amplitude adjusting resistors Rs1 to Rsn is set differently, for example, when it is set such that the oscillation-amplitude adjusting resistor Rs1=10Ω, Rs2=20Ω, Rs3=30Ω, . . . , and when the switches are appropriately turned on, resistance of 10Ω, 20Ω, 30Ω . . . can be obtained. When a plurality of switches are turned on, for example, when switches which correspond to resistance of 10Ω and 20Ω are turned on, 6.7Ω is set. When switches which correspond to resistance of 10Ω and 30Ω are turned on, 7.5Ω is set. When switches which correspond to resistance of 10Ω, 20Ω, and 30Ω are turned on, 5.4Ω is set. In this manner, resistance can be set more finely.

In contrast, when the resistance of the oscillation-amplitude adjusting resistors Rs1 to Rsn is set to the same value, for example, 100Ω, by increasing the number of switches to be turned on from among the switches SW1 to SWn corresponding to the oscillation-amplitude adjusting resistors Rs1 to Rsn, the resistance of the resistor circuit 20 becomes 100Ω, 50Ω, 33Ω, 25Ω, 20Ω . . .

By connecting the resistor circuit 20 between the piezoelectric resonator X and the oscillator circuit 100, an oscillator loop, which consists of the piezoelectric resonator X, the varactor Cv, and the oscillator circuit 100, is formed. By adjusting the resistance of the resistor circuit 20, the oscillation amplitude can be controlled.

Concerning the switches SW1 to SWn, when the voltage-controlled piezoelectric oscillator 10 is formed into an IC, the following arrangement can be configured in accordance with a semiconductor manufacturing process to be used.

When a bipolar process is used as the semiconductor manufacturing process, as shown in FIG. 3(a), the switches SW1 to SWn each have a bipolar transistor structure.

When a CMOS process is used as the semiconductor manufacturing process, as shown in FIG. 3(b), the switches SW1 to SWn each have a MOS transistor structure.

When using a combination bipolar and CMOS process (Bi-CMOS process), which is frequently used as the semiconductor manufacturing process for a high-frequency IC, the switches SW1 to SWn can have either a bipolar transistor structure as shown in FIG. 3(a) or a MOS transistor structure as shown in FIG. 3(b).

In terms of reducing the current consumption, it is more advantageous to employ the MOS transistor structure, which does not require a continuous flow of current in order to turn on the transistor. Since the MOS transistor is a voltage-controlled device, it is only necessary to apply, to the gate terminal, a voltage at a sufficient level to turn on the MOS transistor. The current does not flow steadily from the gate terminal to the source terminal side. In contrast, when the bipolar transistor structure is employed, it is necessary to direct a sufficient flow of current between the base terminal and the emitter terminal, in order to reduce the on-resistance of the transistor in a selection state.

The memory 30 can be formed of a nonvolatile semiconductor memory, such as an EEPROM, which is an electrically erasable type memory, an EPROM, which can be erased by ultraviolet light, a fuse-type ROM, which is a fuse type memory, or the like. In the memory 30, resistor connection control data DR for turning on/off the switches SW1 to SWn, in order to set the resistance of the resistor circuit 20, is stored.

The resistor connection control data DR is written to the memory 30 through the control circuit 40 prior to factory shipment. When the voltage-controlled piezoelectric oscillator 10 is turned on, the resistor connection control signals SC1 to SCn for turning on/off the switches SW1 to SWn are generated by the control circuit 40.

When adjusting the preset resistance, which is set prior to factory shipment, the control circuit 40 turns on/off the switches SW1 to SWn of the resistor circuit 20 based on an adjusting resistor control signal Rcon, which is inputted from the outside through the control circuit signal input terminals or the resistor connecting control signal input terminals CNT1 to CNTn. When adjustment is completed, the control circuit 40 stores the resistor connection control data DR in the memory 30 based on a resistor confirming signal Dcon. In normal operation, the control circuit 40 generates the resistor connection control signals SC1 to SCn based on the resistor connection control data DR stored in the memory 30 and turns on/off the switches SW1 to SWn based on the control signals SC1 to SCn.

Referring to FIGS. 4 and 5, the operation of the resistor circuit 20 is described. FIG. 4 shows frequency variable characteristics for each preset resistance Rsi (i: 1 to n) when an adjusting voltage control signal Vconj applied to the frequency control terminal VC is changed from a high potential to a low potential. FIG. 5 shows the amplitude of an oscillation signal in the oscillator loop.

The resistor circuit 20 connected in the oscillator loop changes the impedance of the oscillator loop, based on the selected resistance from among the oscillation-amplitude adjusting resistors Rsl to Rsn, thereby adjusting the oscillation amplitude. In the following description, the substantial resistance of the resistor circuit 20 is Rs.

As described in the related art, when the control voltage Vc is reduced, and when the amplitude is larger than that of the forward voltage (approximately −0.7 V) of the varactor Cv, that portion is clipped. As a result, there is a difference between the applied control voltage Vc and the actual potential of the varactor Cv.

In this embodiment, by gradually increasing the resistance Rs of the resistor circuit 20, as indicated by arrows in FIG. 5, the oscillation amplitude generated in the oscillator loop is gradually reduced. FIG. 4 shows variation in the frequency variable characteristics.

By setting the resistance of the resistor circuit 20 in order that the oscillation amplitude becomes lower than the forward voltage of the varactor diode Cv (for example, 0.5 V), the frequency variable characteristics change linearly. As a result, the range of frequency changed by the control voltage Vc is increased.

The adjustment operation performed prior to factory shipment will now be described with reference to FIGS. 6 to 9.

The structure of adjusting device 50, shown in FIG. 6, is described below. As shown in FIG. 7, the adjusting device 50 is formed of a microcomputer. The adjusting device 50 includes a CPU 51, a RAM 52, a ROM 53, an adjustment setting switch 54, an adjusting resistor confirming switch 55, an image controller 57 connected to a monitor 56, and an input/output controller 59 connected to a connector 58.

The ROM 53 is a read-only program memory which stores a resistor setting program shown in FIG. 9 and various parameters for performing the program. The CPU 51 executes the resistor setting program read from the ROM 53 to control signals (the adjusting resistor control signal Rcon, the adjusting voltage control signal Vcon, etc.) outputted from the input/output controller 59. The RAM 52 is used as a work area or the like when the CPU 51 performs the program.

Various parameters stored in the ROM 53 include the adjusting resistor control signal Rcon and the adjusting voltage control signal Vcon. FIG. 8 shows the values that correspond to the various signals.

For example, FIG. 8(a) shows values that correspond to the adjusting resistor control signal Rcon. An adjusting resistor control signal Rcon1 turns on the switch SW1 of the resistor circuit 20 and connects the oscillation-amplitude adjusting resistor Rs1 to the oscillator loop. An adjusting resistor control signal Rcon2 turns on the switch SW2 of the resistor circuit 20 and connects the oscillation-amplitude adjusting resistor Rs2 to the oscillator loop. Finally, an adjusting resistor control signal Rconn turns on the switch SWn of the resistor circuit 20 and connects the oscillation-amplitude adjusting resistor Rsn to the oscillator loop.

For example, FIG. 8(b) shows values that correspond to the adjusting voltage control signal Vcon. An adjusting voltage control signal Vcon1 sets the control voltage Vc to 3[V], an adjusting voltage control signal Vcon2 sets the control voltage Vc to 2.9[V] until finally, an adjusting voltage control signal Vconm sets the control voltage Vc to 0[V]. This is outputted to the frequency control terminal VC.

The adjustment setting switch 54 and the adjusting resistor confirming switch 55 are for activating the adjusting operation of the adjusting device 50. The adjustment setting switch 54 and the adjusting resistor confirming switch 55 are provided on a casing (not shown) of the adjusting device 50.

When an operator turns on the adjustment setting switch 54, an enable signal is supplied to the control circuit 40 of the voltage-controlled piezoelectric oscillator 10, thus allowing the adjusting resistor control signal Rcon to be supplied to the switches SW1 to SWn through the control circuit 40. Also in the memory 30, writing of the resistor connection control data DR, which corresponds to the adjusting resistor control signal Rcon, is permitted.

The adjusting resistor confirming switch 55 is operated by the operator by selecting a desired oscillation-amplitude adjusting resistor in accordance with frequency variable characteristics based on each oscillation-amplitude adjusting resistor displayed on the monitor 56. When the switch 55 is operated, the resistor confirming signal Dcon is outputted. The CPU 51 transmits the resistor confirming signal Dcon to the control circuit 40, and the control circuit 40 in turn writes the resistor connection control data DR which corresponds to the confirmed oscillation-amplitude adjusting resistor in the memory 30.

The adjusting operation using the adjusting device 50 will now be described with reference to a flowchart shown in FIG. 9. The resistance of the oscillation-amplitude adjusting resistors Rs1 to Rsn forming the resistor circuit 20 is set to, for example, 10Ω, 20Ω, ... , 100Ω, respectively.

The operator connects the voltage-controlled piezoelectric oscillator 10 to the connector 58 of the adjusting device 50 and turns on the adjustment setting switch 54. At the same time, the CPU 51 reads the resistor setting program and various parameters (the adjusting resistor control signal Rcon and the adjusting voltage control signal Vcon) which are stored in the ROM 53 into the RAM 52.

The CPU 51 starts a resistor setting process in accordance with the resistor setting program.

The CPU 51 initializes coefficients i and j stored in a memory region of the RAM 52 as "i=1" and "j=1" (step S1).

Next, the CPU 51 reads the adjusting resistor control signal Rcon1 from among the parameters stored in the RAM 52 and supplies the control signal Rcon1 to the control circuit signal input terminal or the resistor connection control signal input terminal CNT1 through the input/output controller 59 and the connector 58 (step S2).

In response to the adjusting resistor control signal Rcon1, the control circuit 40 of the voltage-controlled piezoelectric oscillator 10 turns on the switch SW1 of the resistor circuit 20 and connects the oscillation-amplitude adjusting resistor Rs1 to the oscillator loop.

Next, the CPU 51 reads the adjusting voltage control signal Vcon1 (for example 3[V]) from among the parameters stored in the RAM 52 and applies the voltage which corresponds to the control signal Vcon1 to the frequency control terminal VC, through the input/output controller 59 and the connector 58 (step S3).

In the voltage-controlled piezoelectric oscillator 10, the oscillation-amplitude adjusting resistor Rs1 adjusts the oscillation amplitude of the oscillator loop, and subsequently the capacitance of the varactor Cv is changed by the applied adjusting voltage control signal Vcon1. Thus, the oscillation signal S, which has the oscillation frequency f1 due to the resonance with the piezoelectric resonator X, is outputted.

The CPU 51 reads the oscillation frequency f1 from the output terminal OUT (step S4) and computes the frequency deviation $\Delta f1$ ($\Delta f1=(f1-f0)/f0$) with respect to the reference frequency f0 (step S5). Also, the CPU 51 stores the frequency deviation $\Delta f1$ in the RAM 52 (step S6).

The CPU 51 determines whether or not the coefficient j has reached m (step S7). If the coefficient j has not reached m (NO in step S7), it means that the measurement of the frequency deviation $\Delta fj$ has not been completed, in which the control voltage Vc is gradually decreased from 3[V] to 0.1[V], while the resistor circuit 20 is set to the preset resistor Rs1. Thus, the process proceeds to step S8.

The CPU 51 increases the coefficient j by one by computing j=j+1 (step S8). The CPU 51 repeats the processing from step S3 to step S8 until the determination in step S7 becomes affirmative. Every time the processing is repeated, the CPU 51 stores the frequency deviation $\Delta fj$ in correspondence with j in the RAM 52.

In contrast, when the coefficient j has reached m (YES in step S7), the CPU 51 again determines whether or not the coefficient i has reached n (step S9). If the coefficient i has not reached n (NO in step S9), it means that the measurement of the frequency deviation $\Delta fj$ has not been completed, in which the control signal Vconj is gradually decreased from 3[V] to 0.1[V] for each of the preset resistors Rs1 to Rsn of the resistor circuit 20. Thus, the process proceeds to step S10.

The CPU 51 increases the coefficient i by one by computing i=i+1 (step S10). The CPU 51 repeats the processing from step S2 to S9 until the determination in step S9 becomes affirmative. Every time step S6 is performed, the CPU 51 sequentially stores the frequency deviation $\Delta fj$ in correspondence with the oscillation-amplitude adjusting resistor Rsj in the RAM 52.

If the coefficient i has reached n (YES in step S9), the CPU 51 determines that the measurement of the frequency deviation $\Delta fj$ in correspondence with the adjusting voltage control signal Vconj based on the oscillation-amplitude adjusting resistors Rs1 to Rsn is completed.

The CPU 51 reads the frequency deviation $\Delta fj$ stored in the RAM 52 and displays, as shown in FIG. 4, frequency variable characteristics for each oscillation-amplitude adjusting resistor on the monitor 56 through the image controller 57 (step S11).

The operator looks at the frequency variable characteristics for each oscillation-amplitude adjusting resistor and operates the adjusting resistor confirming switch 55 so as to select a desired resistance. Accordingly, the CPU 51 reads the resistor confirming signal Dcon in response to the operation of the adjusting resistor confirming switch 55 (step S12).

In order to connect the oscillation-amplitude adjusting resistor Rsi to the oscillator loop, the CPU 51 transfers the resistor confirming signal Dcon, which is to turn on switch SWi corresponding to the oscillation-amplitude adjusting resistor Rsi, to the control circuit 40 through the input/output controller 59 and the connector 58 (step S13).

In response to the resistor confirming signal Dcon, the control circuit 40 stores the resistor connection control data DR for connecting the confirmed oscillation-amplitude adjusting resistor Rsi to the oscillator loop.

Accordingly, by using the adjusting device 50, the oscillation-amplitude adjusting resistor Rsi of the resistor circuit 20 can be confirmed easily.

FIGS. 10 to 13 show actual exemplary experimental results. In FIGS. 10(a), 11(a), 12(a), and 13(a), frequency variable characteristics in accordance with conditions concerning the reference frequency f0 and the resistance Rs of the resistor circuit 20 are shown. In FIGS. 10(b), 11(b), 12(b), and 13(b), the potential (oscillation amplitude) at the cathode side in accordance with the control voltage Vc is shown. In these cases, the resistance of the oscillation-amplitude adjusting resistors Rs1 to Rsn of the resistor circuit 20 is set to $10\Omega$, $20\Omega$, ..., $100\Omega$, respectively.

In FIGS. 10 and 11, cases in which the reference frequency f0 is 40 MHz are shown. As shown in FIG. 10, when the resistance Rs of the resistor circuit 20 is $0\Omega$, the potential at the cathode side loses linearity when the control voltage Vc is approximately 1.7 V. Accordingly, the frequency variable characteristic loses linearity when the control voltage Vc is approximately 1.7 V. Thus, the frequency can be changed by the control voltage Vc within a range from +10 to 60 [ppm].

When the resistance Rs of the resistor circuit 20 is set to $100\Omega$, as shown in FIG. 11, the potential at the cathode side changes linearly. Accordingly, the frequency variable characteristic also changes linearly. Thus, the frequency can be changed by the control voltage Vc within a range of ±70 [ppm].

In FIGS. 12 and 13, cases in which the reference frequency f0 is 80 MHz are shown. As shown in FIG. 12, when the resistance Rs of the resistor circuit 20 is $0\Omega$, the potential at the cathode side loses linearity when the control voltage Vc is approximately 0.5 V. Accordingly, the frequency variable characteristic also loses linearity when the control voltage Vc is approximately 0.5 V. Thus, the frequency can be changed by the control voltage Vc within a range from −40 to 65 [ppm].

When the resistance Rs of the resistor circuit 20 is set to 30Ω, as shown in FIG. 13, the potential at the cathode side changes linearly. Accordingly, the frequency variable characteristic also changes linearly. Thus, the frequency can be changed by the control voltage Vc within a range of ±70 [ppm].

Concerning the resistor circuit 20, the resistance of the oscillation-amplitude adjusting resistors Rs1 to Rsn which form the resistor circuit 20 is set to 10Ω to 100Ω, respectively, and the resistor circuit 20 is incorporated into the IC chip 15. Accordingly, the single IC chip 15 can handle the piezoelectric resonator X which has different oscillation frequencies f.

According to the first embodiment, the resistor circuit 20, which can change the impedance of the oscillator loop, is connected to the oscillator loop. An appropriate one is selected from among the oscillation-amplitude adjusting resistors Rs1 to Rsn of the resistor circuit 20 in order to make the oscillation amplitude smaller than the forward voltage of the varactor Cv, thereby preventing the oscillation amplitude from being clipped by the forward voltage. Thus, even when the control voltage Vc is set to a low potential, a change in capacitance of the varactor Cv has correspondence with the control voltage Vc. Also, the range of frequency variable characteristic that can be changed by the control voltage VC is increased.

Since the voltage-controlled piezoelectric oscillator 10 includes the memory 30 and the control circuit 40, the oscillation-amplitude adjusting resistor of the resistor circuit 20 can be confirmed after the voltage-controlled piezoelectric oscillator 10 is assembled. Also, the adjustment of frequency variable range can be changed in accordance with a request from a user.

Since the resistor circuit 20 including the oscillation-amplitude adjusting resistors Rs1 to Rsn is incorporated into the IC chip 15, the single IC chip 15 can handle various oscillation frequencies f, and the cost is greatly reduced.

In FIG. 14, a diagram showing a second exemplary embodiment. The same reference numerals are given to components corresponding to those in the first embodiment, and repeated descriptions of the common portions are omitted.

A voltage-controlled piezoelectric oscillator 10A of the second embodiment is characterized in that a structure is employed which, instead of using semiconductor devices to form the switches SW1 to SWn of the resistor circuit 20, uses bonding wires to connect bonding pads exposed on the IC chip 15 to lands on a board, and selects the oscillation-amplitude adjusting resistor (so-called bonding option).

In the voltage-controlled piezoelectric oscillator 10A, the components other than the piezoelectric resonator X and the varactor Cv are formed as an IC chip. On this IC chip, bonding option pads for confirming the oscillation-amplitude adjusting resistors are formed. Concerning the voltage-controlled piezoelectric oscillator 10A, the pads and the lands are connected to each other by the bonding wires in order to confirm the oscillation-amplitude adjusting resistors prior to mold-sealing and assembling the IC chip, the piezoelectric resonator X, and the varactor Cv.

According to the voltage-controlled piezoelectric oscillator 10A, the oscillation-amplitude adjusting resistor is appropriately confirmed, and hence the linear region of the frequency variable characteristic by the control voltage Vc is expanded. As a result, the range of frequency that can be varied by the control voltage Vc is increased.

Since the voltage-controlled piezoelectric oscillator 10A does not include the memory 30 and the control circuit 40, the area of the IC chip is minimized, and the number of components is reduced.

In FIG. 15, a diagram showing a third exemplary embodiment. The same reference numerals are given to components corresponding to those in the first embodiment, and repeated descriptions of the common portions are omitted.

A voltage-controlled piezoelectric oscillator 10B of the third embodiment is characterized in that control voltage input terminals CNT1' to CNTn', to which a control voltage for activating the switches SW1 to SWn is applied, are exposed to the outside of the IC.

In the voltage-controlled piezoelectric oscillator 10B, the control voltage applied from the outside through the control voltage input terminals CNT1' to CNTn' is used to confirm the amplitude-oscillation adjusting resistor.

Concerning the voltage-controlled piezoelectric oscillator 10B, the oscillation-amplitude adjusting resistor is appropriately selected by a selection signal from the outside, and hence the range of frequency variable characteristic that can be varied by the control voltage Vc is increased.

Since the voltage-controlled piezoelectric oscillator 10B does not include the memory 30 and the control circuit 40, the area of the IC chip is minimized, and the number of components is reduced.

According to the foregoing embodiments, it is impossible to adjust the gap between the reference oscillation frequency f0 when Vc=Vc0 and the actual oscillation frequency f0' when Vc=Vc0 caused by variations in the piezoelectric resonator X, IC, and the like. As shown in FIG. 16, a frequency regulating circuit 21 can be connected to the anode side of the varactor Cv. The frequency regulating circuit 21 includes a base capacitor Cg which functions as a fixed-capacitance element, n capacitors Ca1 to Can which function as selectable-capacitance elements, and switches SW1 to SWn' which connect the capacitors Ca1 to Can in parallel. Accordingly, by appropriately setting the electrostatic capacitance of the frequency regulating circuit 21, the actual oscillation frequency f0' when Vc=Vc0 can be adjusted to the reference oscillation frequency f0.

In FIG. 17, an exemplary block diagram of a voltage-controlled piezoelectric oscillator of this modification is shown. This voltage-controlled piezoelectric oscillator differs from the foregoing embodiments in that a CMOS oscillator circuit including a CMOS inverter INV is used as the oscillator circuit and that the resistor circuit 20, similar to that of the first embodiment, is applied to the CMOS oscillator circuit. When the present invention is applied to the CMOS oscillator circuit, it is possible to achieve advantages similar to those in the first embodiment. Accordingly, by connecting the frequency regulating circuit 21 of the first modification, the reference frequency f0 can be adjusted.

According to the voltage-controlled piezoelectric oscillator 10 of the first embodiment, the components other than the piezoelectric resonator X and the varactor Cv are formed as the IC chip 15, and the IC chip 15, the piezoelectric resonator X, and the varactor Cv are mold-sealed. However, the present invention is not limited to this structure. As shown in FIG. 18, the components (including the varactor Cv) other than the piezoelectric resonator X are formed as an IC chip 16, and the IC chip 16 and the piezoelectric resonator X can be mold-sealed.

In the first embodiment, when the adjusting device 50 confirms the oscillation-amplitude adjusting resistor, the operator monitors the frequency variable characteristics and thereafter confirms the desired oscillation-amplitude adjusting resistor. However, it is to be understood that the present invention is not limited to this embodiment. By determining whether or not a differential value obtained by differentiating the measured frequency deviation Δf exceeds a threshold value, the oscillation-amplitude adjusting resistor is automatically confirmed. Accordingly, as long as the linearity of frequency variable characteristics is improved, any method for confirming the oscillation-amplitude adjusting resistor can be used without departing from the spirit and scope of the present invention.

In the foregoing embodiments, the range of frequency that can be varied by the control voltage Vc is increased by improving the linearity of frequency variable characteristics. In contrast, when it is possible to know the relationship between the oscillation-amplitude adjusting resistor Rs and the frequency variable characteristic in advance, particularly the point at which the frequency deviation Δf becomes constant after the frequency variable characteristic becomes nonlinear, then it is possible to set, for example, a region in which the control voltage Vc is Vc1 or greater as a range in which the frequency can be changed, and a region in which the control voltage Vc is Vc1 or smaller as a range in which the frequency does not vary.

According to the present invention, the linearity of frequency variable characteristics can be improved, and the range of frequency that can be varied by a control voltage can be increased.

Thus, while the systems and methods of this invention have been described in conjunction with the specific embodiments outlined above, it is evident that many alternatives, modifications and variations will be apparent to those skilled in the art. Accordingly, the exemplary embodiments of the systems and methods of this invention, as set forth above, are intended to be illustrative, not limiting. Various changes may be made without departing from the spirit and scope of the invention.

What is claimed is:

1. A voltage-controlled oscillator, comprising:
   a piezoelectric resonator;
   a variable reactance element connected in series to the input side of said piezoelectric resonator;
   an oscillator circuit connected to said variable reactance element; and
   a resistor circuit provided in an oscillator loop including said piezoelectric resonator, said variable reactance element, and said oscillator circuit, said resistor circuit including a plurality of oscillation-amplitude adjusting resistors which are selectively inserted into said oscillator loon to adjust an amplitude of an oscillation.

2. A voltage-controlled oscillator according to claim 1, wherein said resistor circuit further comprises a switch for connecting or disconnecting the oscillation-amplitude adjusting resistors based on a resistor connection control signal.

3. A voltage-controlled oscillator according to claim 2, wherein said switch comprises a semiconductor switch.

4. A voltage-controlled oscillator according to claim 2, further comprising:
   a resistor information memory that stores resistor connection control data; and
   a control circuit that stores the resistor connection control data beforehand in said resistor information memory, based on an adjusting resistor control signal which is externally supplied, and that outputs a resistor connection control signal for controlling the switch based on at least one of the adjusting resistor control signal and the resistor connection control data.

5. A voltage-controlled oscillator according to claim 1, wherein said resistor circuit is such that a first end of each of the oscillation-amplitude adjusting resistors is connected to the oscillator loop and a second end comprises a bonding pad.

6. A voltage-controlled oscillator according to claim 1, further comprising;
   a capacitor circuit connected to said variable reactance element, said capacitor circuit including a plurality of selectable-capacitance elements; and
   a capacitance connecting circuit that connects to said variable reactance element a desired capacitive element from among the selectable-capacitance elements.

7. A voltage-controlled oscillator according to claim 1, said piezoelectric resonator being a crystal resonator.

8. A voltage-controlled oscillator according to claim 1, wherein components other than said piezoelectric resonator and said variable reactance element are formed as an IC chip.

9. A voltage-controlled oscillator according to claim 8, said IC chip, said piezoelectric resonator, and said variable reactance element being integrally mold-sealed.

10. A voltage-controlled oscillator according to claim 8, said IC chip, said piezoelectric resonator, and said variable reactance element being contained in a single package.

11. A voltage-controlled oscillator according to claim 8, said piezoelectric resonator and said variable reactance element being integrally mold-sealed.

12. A voltage-controlled oscillator according to claim 8, said piezoelectric resonator and said variable reactance element being contained in a single package.

13. A voltage-controlled oscillator according to claim 1, wherein components other than said piezoelectric resonator are formed as an IC chip.

14. A voltage-controlled oscillator according to claim 13, said IC chip and said piezoelectric resonator being integrally mold-sealed.

15. A voltage-controlled oscillator according to claim 13, said IC chip and said piezoelectric resonator being contained in a single package.

16. A resistance regulating apparatus for selecting a desired oscillation-amplitude adjusting resistor with respect to a voltage-controlled oscillator as set forth in claim 1, said resistance regulating apparatus comprising:
   a frequency detecting device that sequentially selects one from among oscillation-amplitude adjusting resistors and detects the frequency of an oscillation signal in a state in which a predetermined reference control voltage is gradually applied to a control voltage terminal; and
   an oscillation-amplitude adjusting resistor confirming device that confirms the desired oscillation-amplitude adjusting resistor which corresponds to a predetermined oscillation frequency, based on the detected frequency of each oscillation-amplitude adjusting resistor.

17. A resistance regulating apparatus for selecting a desired oscillation-amplitude adjusting resistor with respect to a voltage-controlled oscillator as set forth in claim 1, said resistance regulating apparatus comprising:
   a frequency detecting device that sequentially selects one from among oscillation-amplitude adjusting resistors and detects the frequency of an oscillation signal in a state in which a predetermined reference control voltage is gradually applied to a control voltage terminal;

a frequency variable characteristic generator that generates a frequency variable characteristic of each oscillation-amplitude adjusting resistor, based on the detected frequency of each oscillation-amplitude adjusting resistor; and an oscillation-amplitude adjusting resistor confirming device that confirms the desired oscillation-amplitude adjusting resistor which corresponds to a predetermined oscillation frequency, based on the generated frequency variable characteristic of each oscillation-amplitude adjusting resistor.

18. A resistance regulating method for selecting a desired oscillation-amplitude adjusting resistor with respect to a voltage-controlled oscillator as set forth in claim 1, said resistance regulating method comprising:

a frequency detecting step of sequentially selecting one from among oscillation-amplitude frequency adjusting resistors and detecting the frequency of an oscillation signal in a state in which a predetermined reference control voltage is gradually applied to a control voltage terminal; and an oscillation-amplitude adjusting resistor confirming step of confirming the desired oscillation-amplitude adjusting resistor which corresponds to a predetermined oscillation frequency, based on the detected frequency of each oscillation-amplitude adjusting resistor.

19. A resistance regulating method for selecting a desired oscillation-amplitude adjusting resistor with respect to a voltage-controlled oscillator as set forth in claim 1, said resistance regulating method comprising:

a frequency detecting step of sequentially selecting one from among oscillation-amplitude adjusting resistors and detecting the frequency of an oscillation signal in a state in which a predetermined reference control voltage is gradually applied to a control voltage terminal;

a frequency variable characteristic generating step of generating a frequency variable characteristic of each oscillation-amplitude adjusting resistor, based on the detected frequency of each oscillation-amplitude adjusting resistor; and an oscillation-amplitude adjusting resistor confirming step of confirming the desired oscillation-amplitude adjusting resistor, based on the generated frequency variable characteristic of each oscillation-amplitude adjusting resistor.

20. An IC chip for a voltage-controlled oscillator, said voltage-controlled oscillator including a piezoelectric resonator, a variable reactance element connected in series to the input side of said piezoelectric resonator, and an oscillator circuit connected to said variable reactance circuit, said IC chip comprising:

a resistor circuit provided in an oscillator loop including said piezoelectric resonator, said variable reactance element, and said oscillator circuit, said resistor circuit comprising a plurality of oscillation-amplitude adjusting resistors which are selectively inserted to adjust am amplitude of an oscillation.

* * * * *